(12) United States Patent
Murakami et al.

(10) Patent No.: US 8,184,408 B2
(45) Date of Patent: May 22, 2012

(54) MAGNETORESISTIVE ELEMENT AND METHOD OF MANUFACTURING THE SAME

(75) Inventors: Shuichi Murakami, Fuchu (JP);
 Hideaki Fukuzawa, Kawasaki (JP);
 Hiromi Yuasa, Kawasaki (JP);
 Yoshihiko Fuji, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 571 days.

(21) Appl. No.: 12/320,668

(22) Filed: Jan. 30, 2009

(65) Prior Publication Data
US 2009/0190262 A1 Jul. 30, 2009

(30) Foreign Application Priority Data

Jan. 30, 2008 (JP) ................................. 2008-019365

(51) Int. Cl.
*G11B 5/39* (2006.01)
*H01L 29/82* (2006.01)

(52) U.S. Cl. ........... 360/324.11; 360/324.1; 360/324.12; 360/324.2; 257/421; 257/422

(58) Field of Classification Search .............. 360/324.11
See application file for complete search history.

(56) References Cited

U.S. PATENT DOCUMENTS

| | | | |
|---|---|---|---|
| 5,304,975 A | 4/1994 | Saito et al. | |
| 5,313,186 A | 5/1994 | Schuhl et al. | |
| 5,448,515 A | 9/1995 | Fukami et al. | |
| 5,459,687 A | 10/1995 | Sakakima et al. | |
| 5,549,978 A | 8/1996 | Iwasaki et al. | |
| 5,617,071 A | 4/1997 | Daughton | |
| 5,715,121 A | 2/1998 | Sakakima et al. | |
| 5,768,181 A | 6/1998 | Zhu et al. | |
| 5,768,183 A | 6/1998 | Zhu et al. | |
| 5,880,911 A | 3/1999 | Ishihara et al. | |
| 5,936,402 A | 8/1999 | Schep et al. | |
| 6,002,553 A | 12/1999 | Stearns et al. | |
| 6,013,365 A | 1/2000 | Dieny et al. | |
| 6,137,662 A | 10/2000 | Huai et al. | |
| 6,147,843 A | 11/2000 | Yamamoto et al. | |
| 6,205,008 B1 | 3/2001 | Gijs et al. | |
| 6,303,218 B1 * | 10/2001 | Kamiguchi et al. | 428/332 |
| 6,348,274 B1 | 2/2002 | Kamiguchi et al. | |
| 6,400,537 B2 | 6/2002 | Sakakima et al. | |

(Continued)

FOREIGN PATENT DOCUMENTS

JP 6-326374 11/1994

(Continued)

OTHER PUBLICATIONS

U.S. Appl. No. 12/320,669, filed Jan. 30, 2009.

(Continued)

*Primary Examiner* — Son Mai
(74) *Attorney, Agent, or Firm* — Nixon & Vanderhye, P.C.

(57) ABSTRACT

A magnetoresistive element includes a magnetoresistive film including a magnetization pinned layer, a magnetization free layer, an intermediate layer arranged between the magnetization pinned layer and the magnetization free layer, a cap layer arranged on the magnetization pinned layer or on the magnetization free layer, and a functional layer formed of an oxygen- or nitrogen-containing material and arranged in the magnetization pinned layer, or in the magnetization free layer, and a pair of electrodes which pass a current perpendicularly to a plane of the magnetoresistive film, in which a crystalline orientation plane of the functional layer is different from a crystalline orientation plane of its upper or lower adjacent layer.

20 Claims, 17 Drawing Sheets

U.S. PATENT DOCUMENTS

| | | |
|---|---|---|
| 6,452,763 B1 | 9/2002 | Gill |
| 6,473,275 B1 | 10/2002 | Gill |
| 6,522,507 B1 | 2/2003 | Horng et al. |
| 6,556,390 B1 | 4/2003 | Mao et al. |
| 6,567,246 B1 | 5/2003 | Sakakima et al. |
| 6,603,642 B1 | 8/2003 | Araki et al. |
| 6,636,391 B2 | 10/2003 | Watanabe et al. |
| 6,686,068 B2 | 2/2004 | Carey et al. |
| 6,770,382 B1 | 8/2004 | Chang et al. |
| 6,784,509 B2 | 8/2004 | Yuasa et al. |
| 6,816,347 B2 * | 11/2004 | Koi et al. ............. 360/324.11 |
| 6,853,520 B2 | 2/2005 | Fukuzawa et al. |
| 6,882,509 B2 * | 4/2005 | Chang et al. ............. 360/324.1 |
| 6,905,780 B2 | 6/2005 | Yuasa et al. |
| 6,934,132 B2 | 8/2005 | Hayashi et al. |
| 6,937,446 B2 | 8/2005 | Kamiguchi et al. |
| 7,190,558 B2 | 3/2007 | Iwasaki et al. |
| 7,196,877 B2 | 3/2007 | Yoshikawa et al. |
| 7,218,483 B2 | 5/2007 | Yuasa et al. |
| 7,301,733 B1 * | 11/2007 | Fukuzawa et al. ......... 360/324.1 |
| 7,359,162 B2 | 4/2008 | Kamiguchi et al. |
| 7,479,394 B2 | 1/2009 | Horng et al. |
| 7,483,245 B2 | 1/2009 | Kamiguchi et al. |
| 7,505,234 B2 | 3/2009 | Fukuzawa et al. |
| 7,514,117 B2 * | 4/2009 | Fukuzawa et al. ............ 427/127 |
| 7,542,248 B2 | 6/2009 | Kamiguchi et al. |
| 7,593,195 B2 | 9/2009 | Fukuzawa et al. |
| 7,663,197 B2 * | 2/2010 | Nagase et al. ............... 257/421 |
| 7,663,848 B1 * | 2/2010 | Huai et al. ................ 360/324.2 |
| 7,776,387 B2 * | 8/2010 | Fuji et al. ..................... 427/127 |
| 7,810,228 B2 * | 10/2010 | Yuasa et al. ................ 29/603.16 |
| 7,843,669 B2 | 11/2010 | Fukuzawa et al. |
| 7,859,797 B2 * | 12/2010 | Hoshino et al. ............... 360/319 |
| 2001/0004307 A1 | 6/2001 | Saito et al. |
| 2002/0036876 A1 | 3/2002 | Kawawake et al. |
| 2002/0051380 A1 | 5/2002 | Kamiguchi et al. |
| 2002/0073785 A1 | 6/2002 | Prakash et al. |
| 2002/0150791 A1 | 10/2002 | Yuasa et al. |
| 2003/0011463 A1 | 1/2003 | Iwasaki et al. |
| 2003/0011945 A1 | 1/2003 | Yuasa et al. |
| 2003/0016475 A1 | 1/2003 | Hoshiya et al. |
| 2003/0035256 A1 | 2/2003 | Hayashi et al. |
| 2003/0168673 A1 | 9/2003 | Yuasa et al. |
| 2004/0021990 A1 | 2/2004 | Koui et al. |
| 2004/0130431 A1 | 7/2004 | Matsukawa et al. |
| 2004/0190204 A1 | 9/2004 | Yoshikawa et al. |
| 2005/0052788 A1 | 3/2005 | Kamiguchi et al. |
| 2006/0034022 A1 | 2/2006 | Fukuzawa et al. |
| 2007/0081276 A1 | 4/2007 | Fukuzawa et al. |
| 2007/0202249 A1 | 8/2007 | Yuasa et al. |
| 2008/0062577 A1 | 3/2008 | Fukuzawa et al. |
| 2008/0068764 A1 | 3/2008 | Fukuzawa et al. |
| 2008/0088981 A1 | 4/2008 | Kamiguchi et al. |
| 2008/0158737 A1 | 7/2008 | Kamiguchi et al. |
| 2009/0141408 A1 | 6/2009 | Fukuzawa et al. |

FOREIGN PATENT DOCUMENTS

| | | |
|---|---|---|
| JP | 9-050609 | 2/1997 |
| JP | 09-205234 | 8/1997 |
| JP | 11-168249 | 6/1999 |
| JP | 2000-67418 | 3/2000 |
| JP | 2000-188435 | 7/2000 |
| JP | 2000-215414 | 8/2000 |
| JP | 2001-237471 | 8/2001 |
| JP | 2001-332781 | 11/2001 |
| JP | 2002-150512 | 5/2002 |
| JP | 2003-031867 | 1/2003 |
| JP | 2003-152243 | 5/2003 |
| JP | 2004-6589 | 1/2004 |
| JP | 2004-039672 | 2/2004 |
| JP | 2004-214251 | 7/2004 |
| JP | 2005-109378 | 4/2005 |
| JP | 2005-150482 | 6/2005 |
| JP | 2007-173843 | 7/2007 |
| JP | 2007-214333 | 8/2007 |
| WO | 03/092083 | 11/2003 |

OTHER PUBLICATIONS

Murakami et al., U.S. Appl. No. 12/320,669, filed Jan. 30, 2009.
Fukuzawa et al.., U.S. Appl. No. 10/400,690, filed Mar. 28, 2003.
Fukuzawa et al., U.S. Appl. No. 11/609,557, filed Dec. 12, 2006.
Fukuzawa et al., U.S. Appl. No. 11/930,699, filed Oct. 31, 2007.
Fukuzawa et al., U.S. Appl. No. 11/931,089, filed Oct. 31, 2007.
Fukuzawa et al., U.S. Appl. No. 12/366,972, filed Feb. 6, 2009.
Fukuzawa et al., U.S. Appl. No. 12/468,467, filed May 19, 2009.
Fukuzawa et al., U.S. Appl. No. 12/468,485, filed May 19, 2009.
Kamiguchi et al., U.S. Appl. No. 09/947,355, filed Sep. 7, 2001.
Kamiguchi et al., U.S. Appl. No. 10/970,278, filed Oct. 22, 2004.
Kamiguchi et al., U.S. Appl. No. 11/984,865, filed Nov. 23, 2007.
Kamiguchi et al., U.S. Appl. No. 12/042,166, filed 030/04/2008.
S. Sanvito et al.; "Breakdown of the Resistor Model of CPP-GMR in Magnetic Multilayered Nanostructures", Physical Review B., vol. 61, No. 20, May 15, 2000, pp. 14225-14228 (Abstract).
Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317 (Abstract).
B. Dieny, et al., "Magnetotransport Properties of Magnetically Soft Spin-Valve Structures (Invited)", J. Appl. Phys., vol. 69 (8), Apr. 15, 1991, pp. 4774-4779.
B. Dieny, et al. "Giant Magnetoresistance of Magnetically Soft Sandwiches: Dependence on Temperature and on Layer Thicknesses", Physical Review B, vol. 45, No. 2, Jan. 1, 1992, pp. 806-813.
D. Bozec et al., Comparative Study of the Magnetoresistance of MBE-Grown Multilayers: [Fe/Cu/Co/Cu] N and [Fe/Cu]N[Co/Cu]N, Physical Review B, vol. 5, Aug. 1, 1999, pp. 3037-3039 (Abstract).
I. I. Mazin, "How to Define and Calculate the Degree of Spin Polarization in Ferromagnetics", Physical Review Letters, vol. 83, No. 7, Aug. 16, 1999, pp. 1427-1430 (Abstract).
Office Action dated Nov. 30, 2010 in Korean Application No. 10-2009-6863, and English-language translation thereof.
Zhao et al., "Inverse Magnetroresistance Caused by Nano-Nitride-Layer Doping at the Inner Interfaces in the Sandwich of Co/Cu/Co", J. Appl. Phys. 99, 08R507 (2006), 4 pages.
Office Action dated Dec. 20, 2011 in JP Application No. 2008-019365 with English-language translation.

* cited by examiner

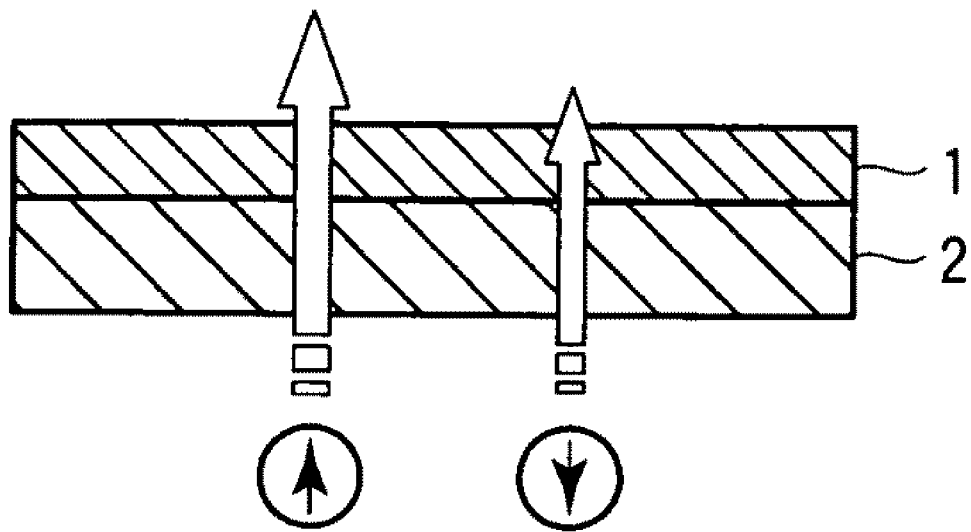
F I G. 1A
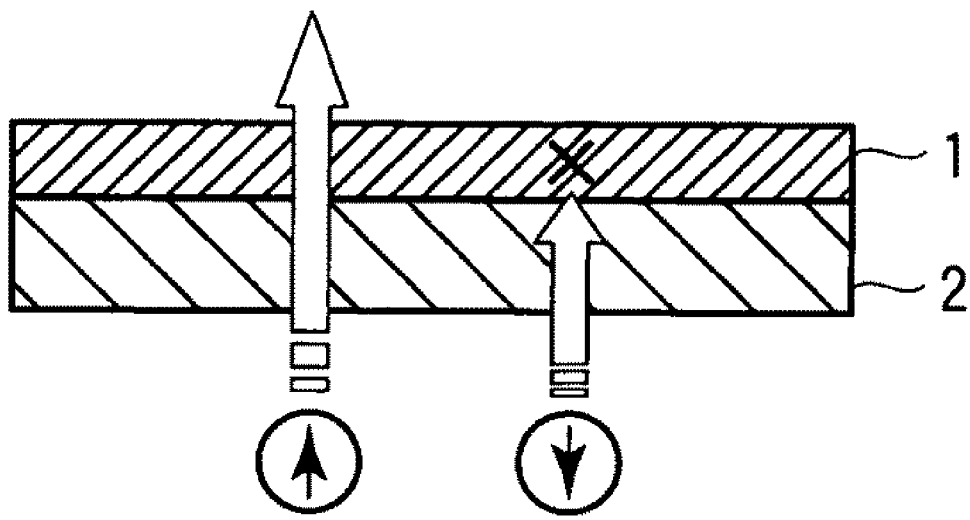
F I G. 1B

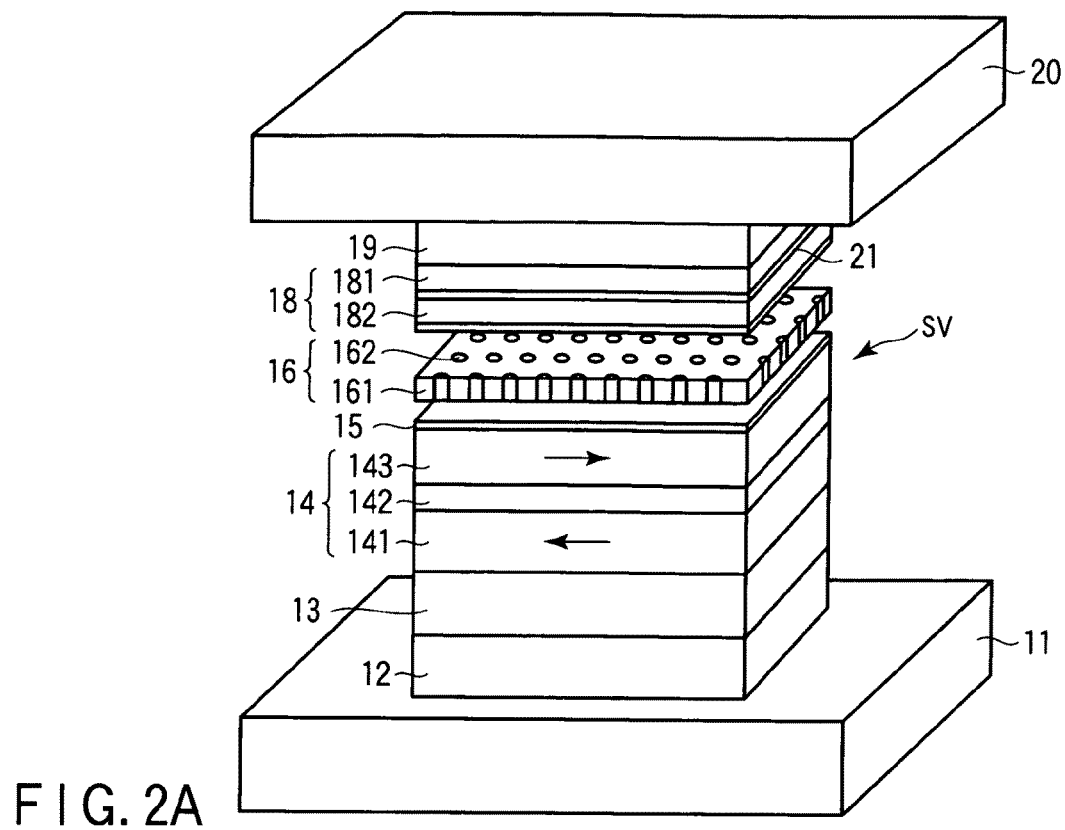
F I G. 2A
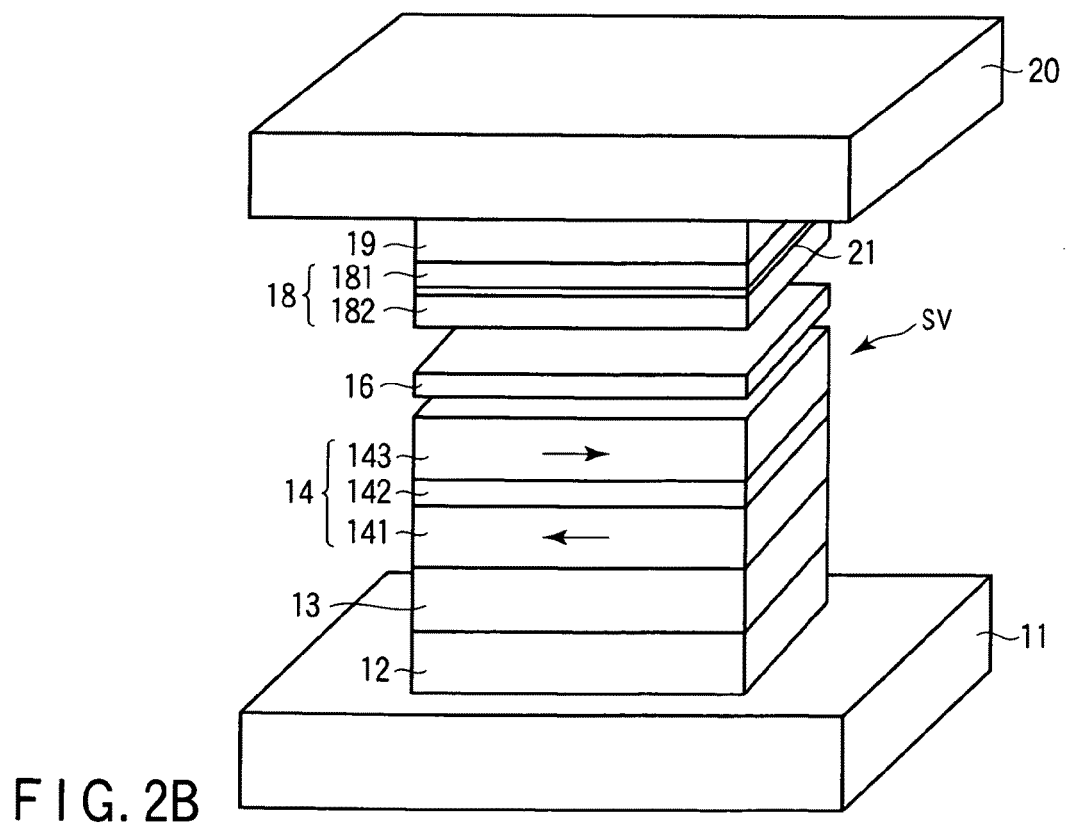
F I G. 2B

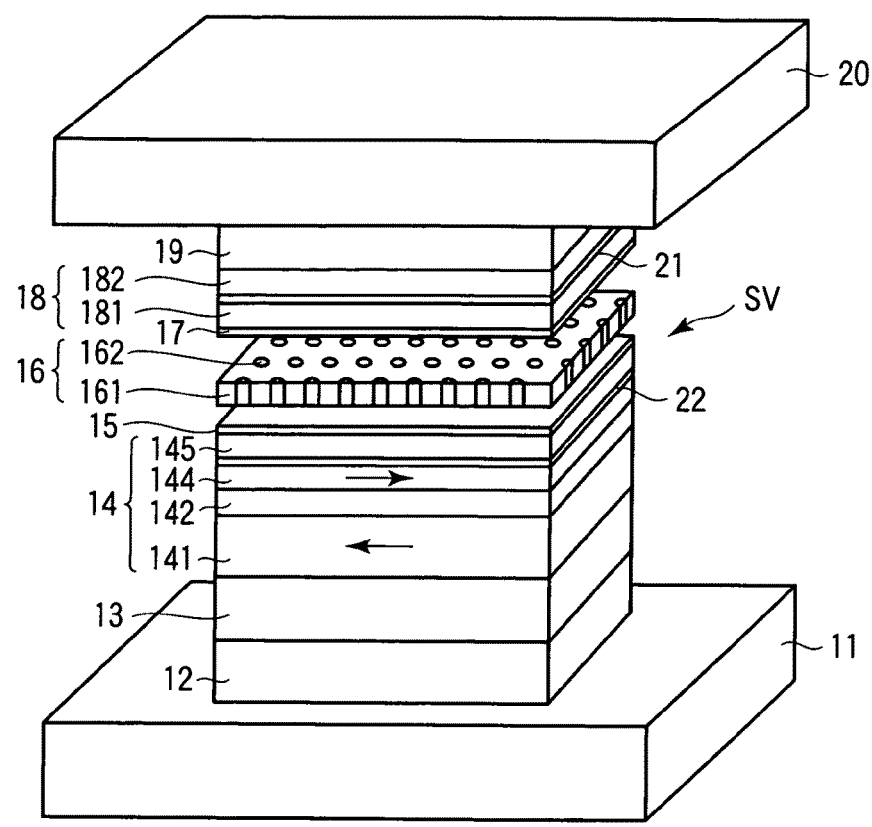
F I G. 4A
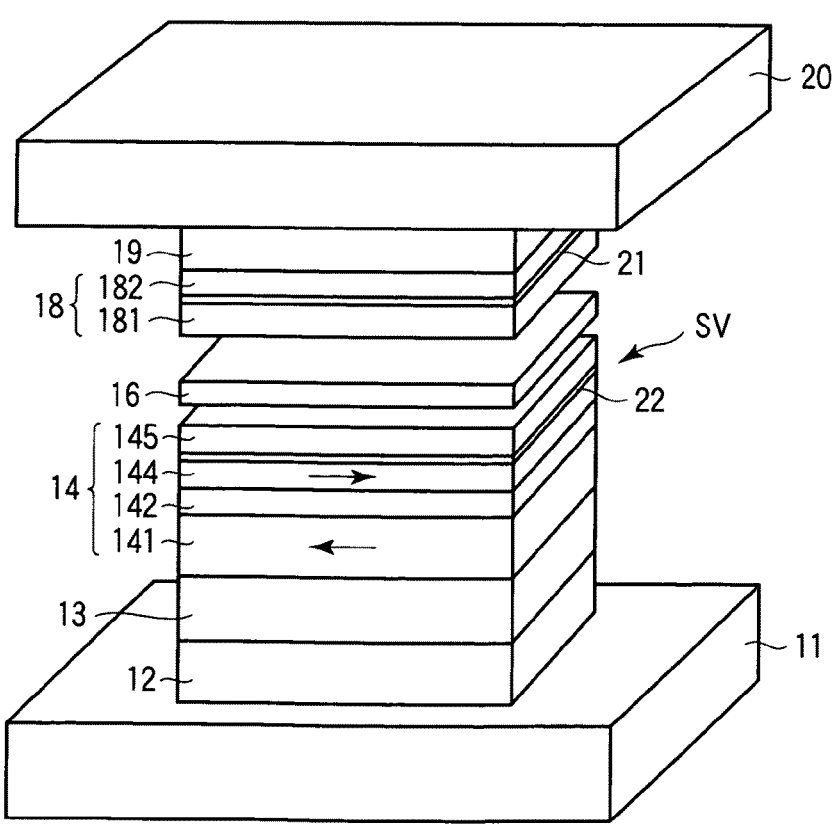
F I G. 4B

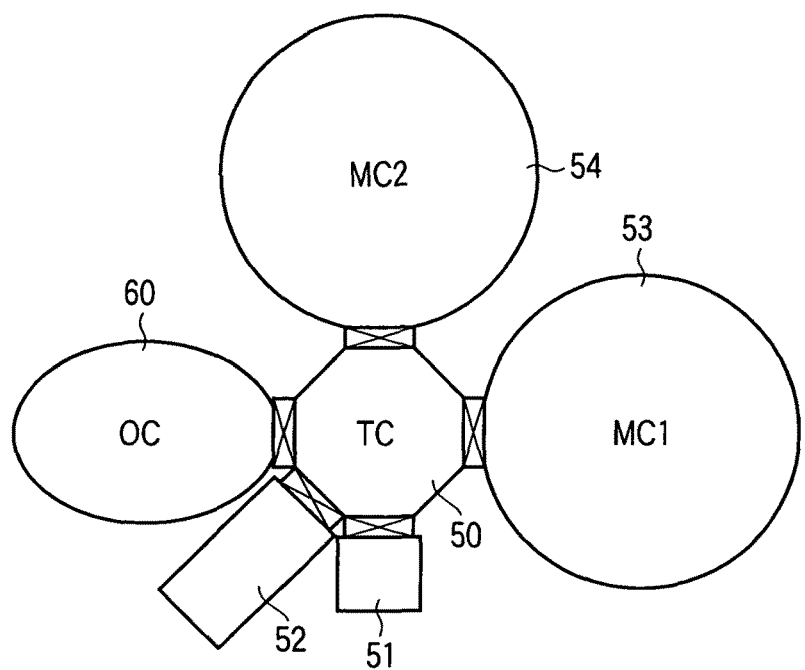
F I G. 6
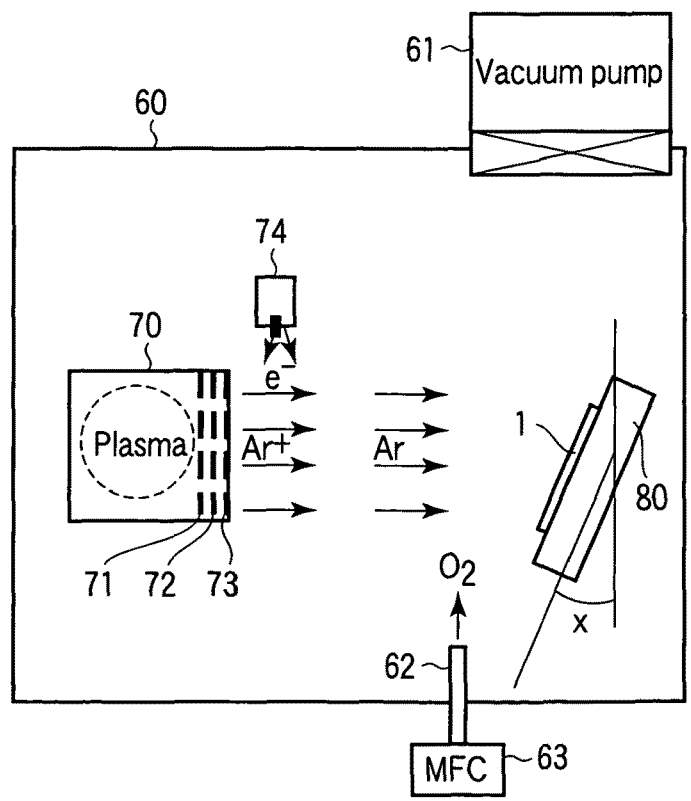
F I G. 7

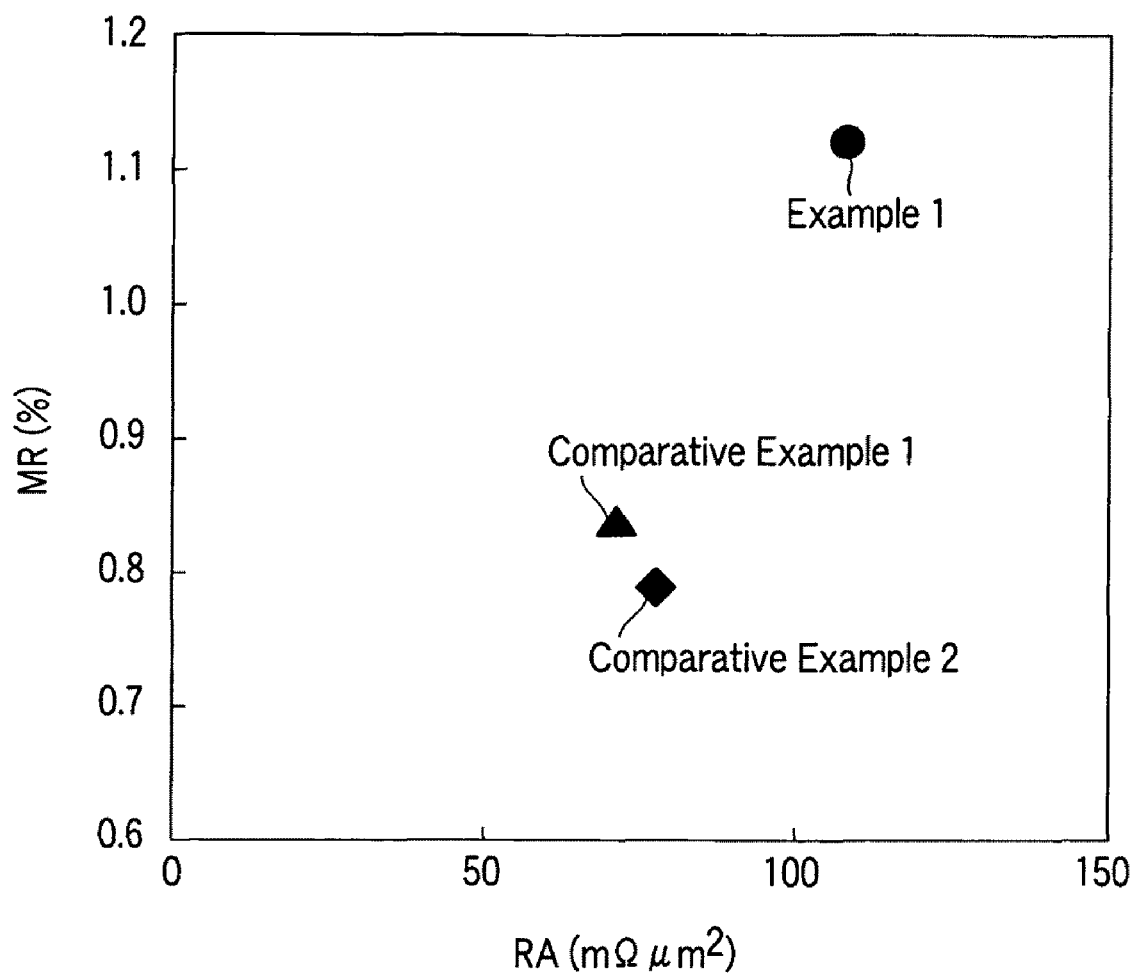
F I G. 8

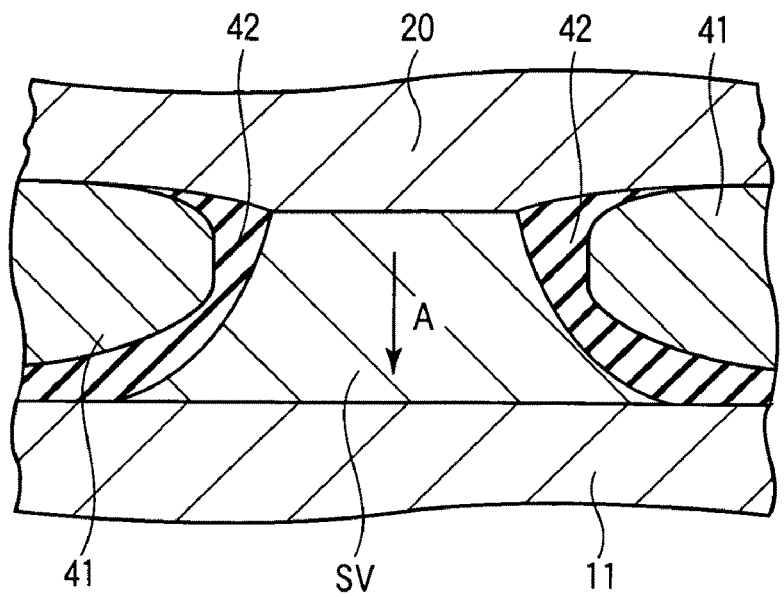
F I G. 12
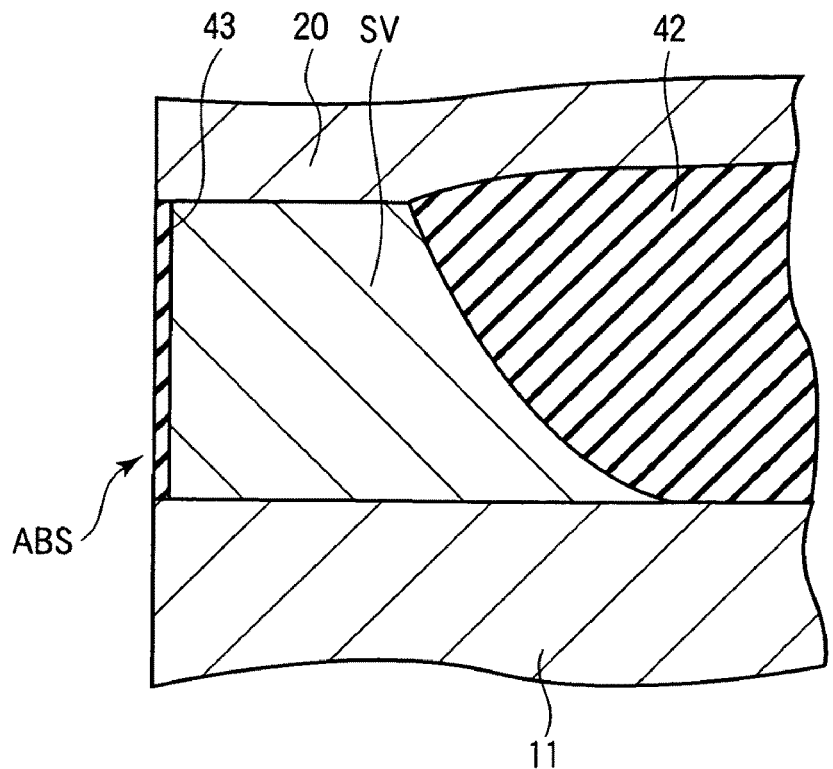
F I G. 13

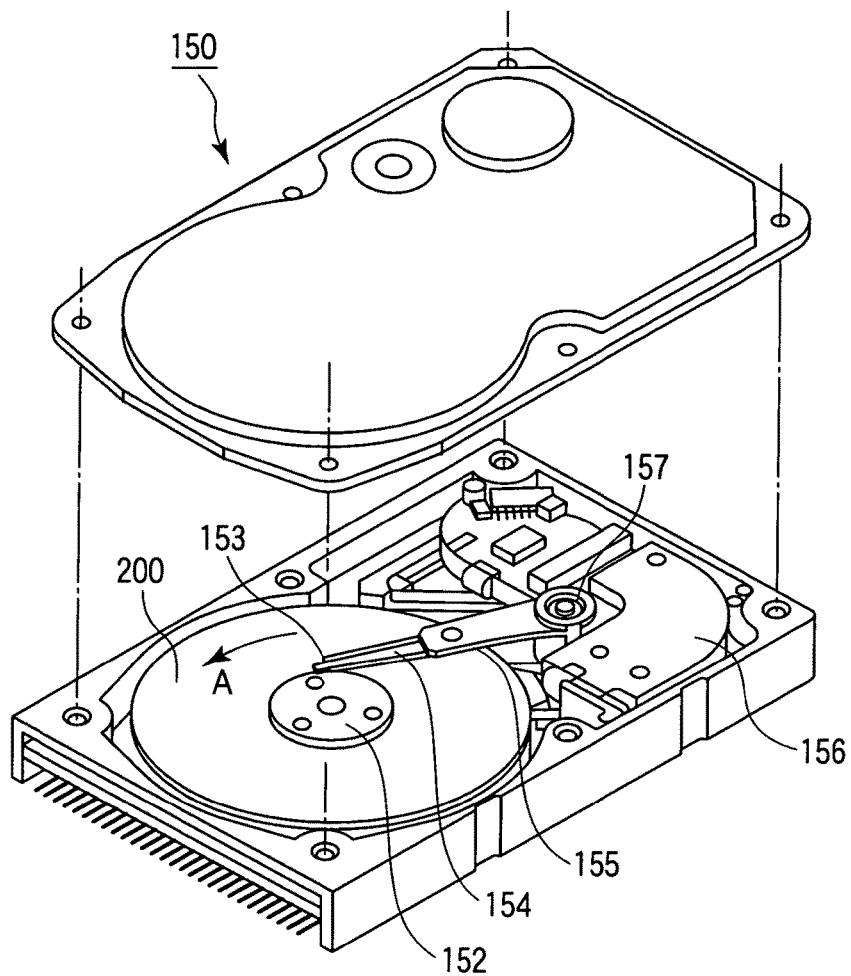
F I G. 14
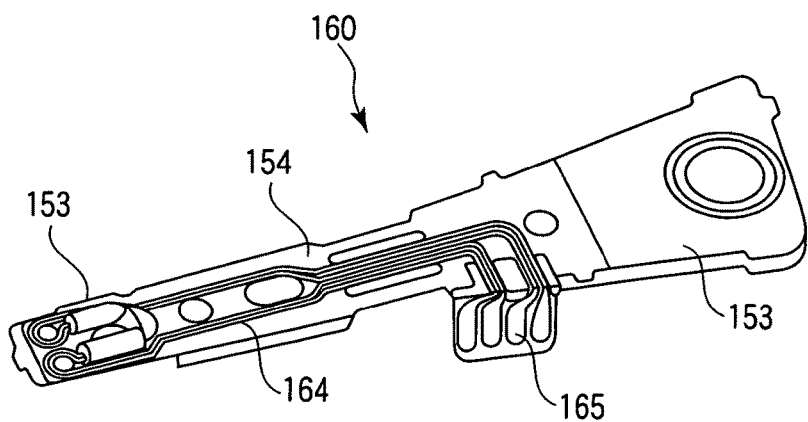
F I G. 15

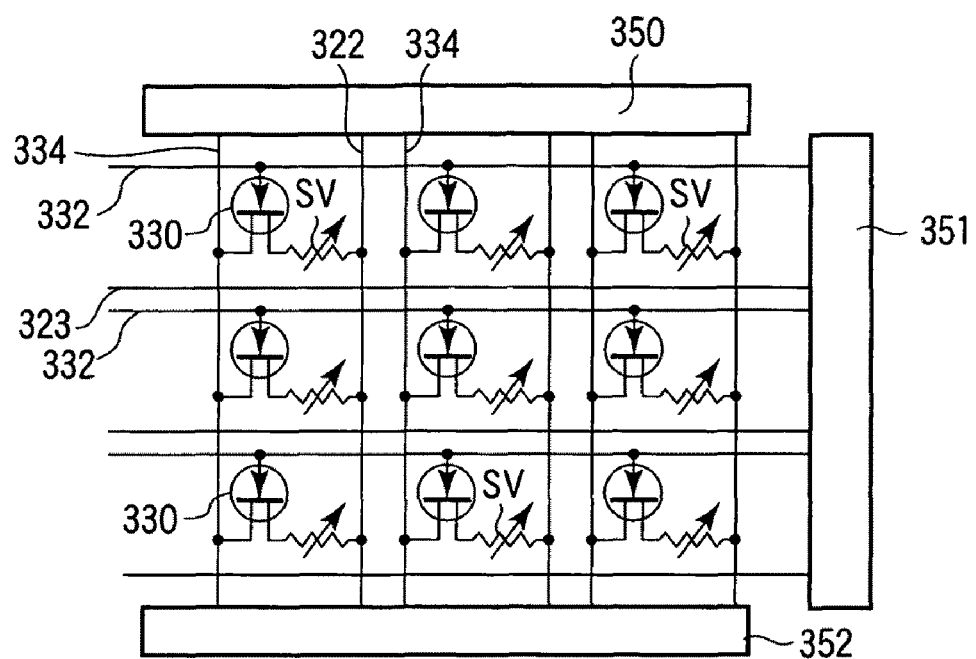
F I G. 16
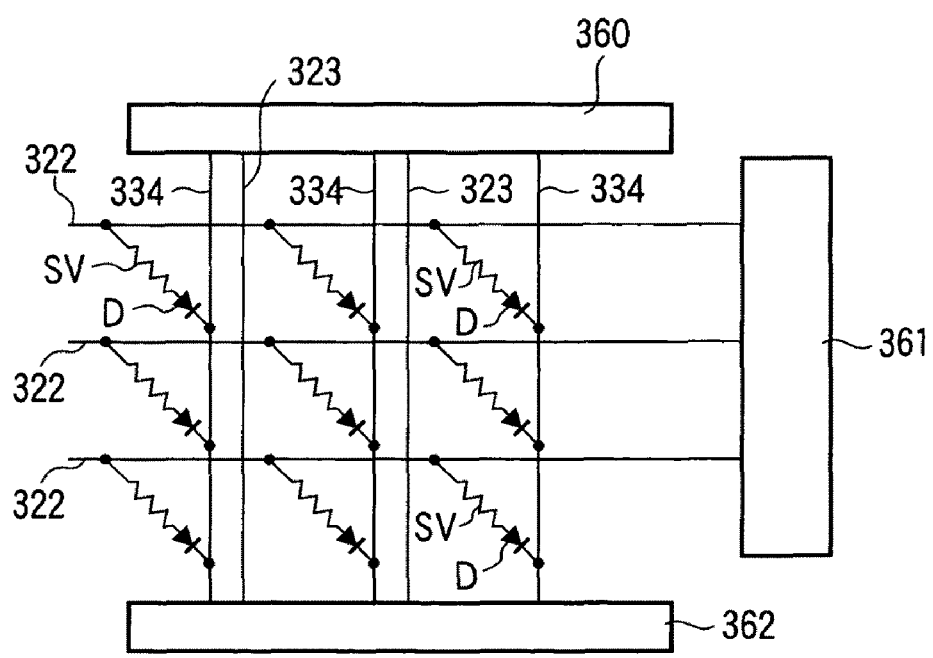
F I G. 17

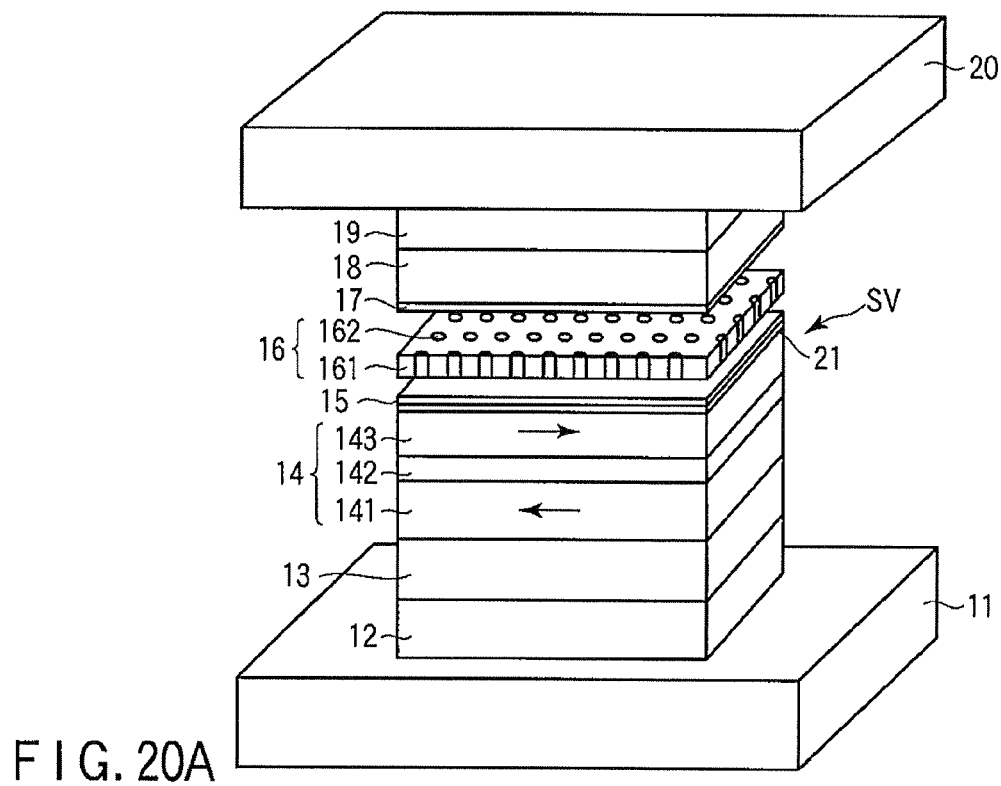
F I G. 20A
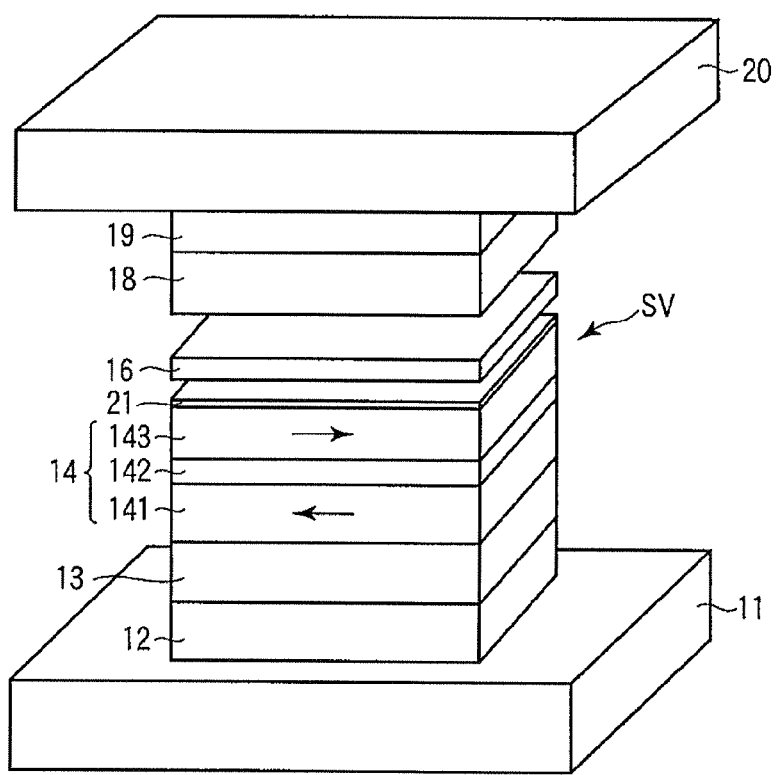
F I G. 20B

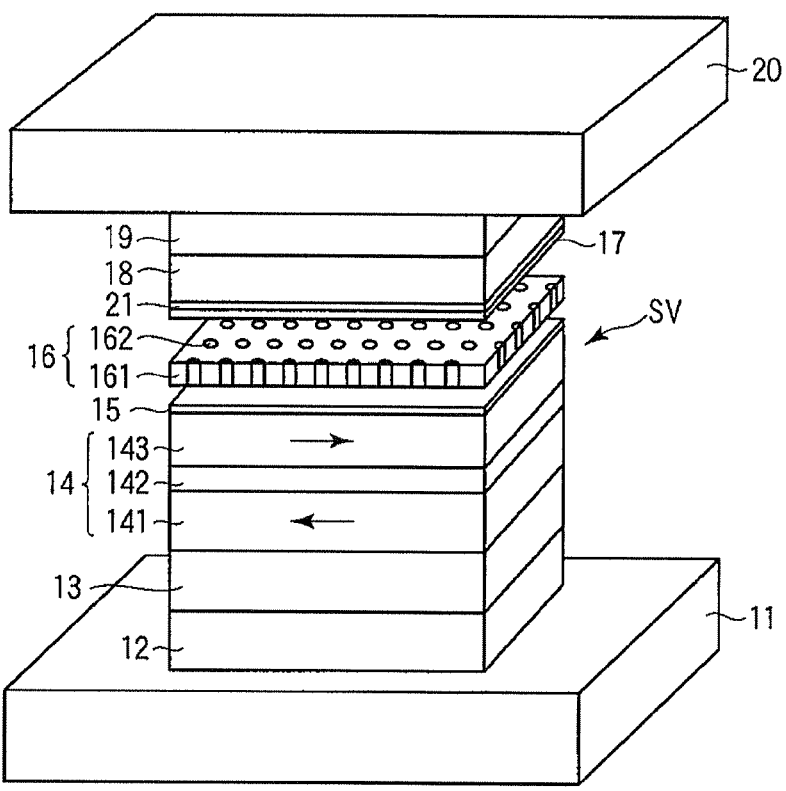
F I G. 21A
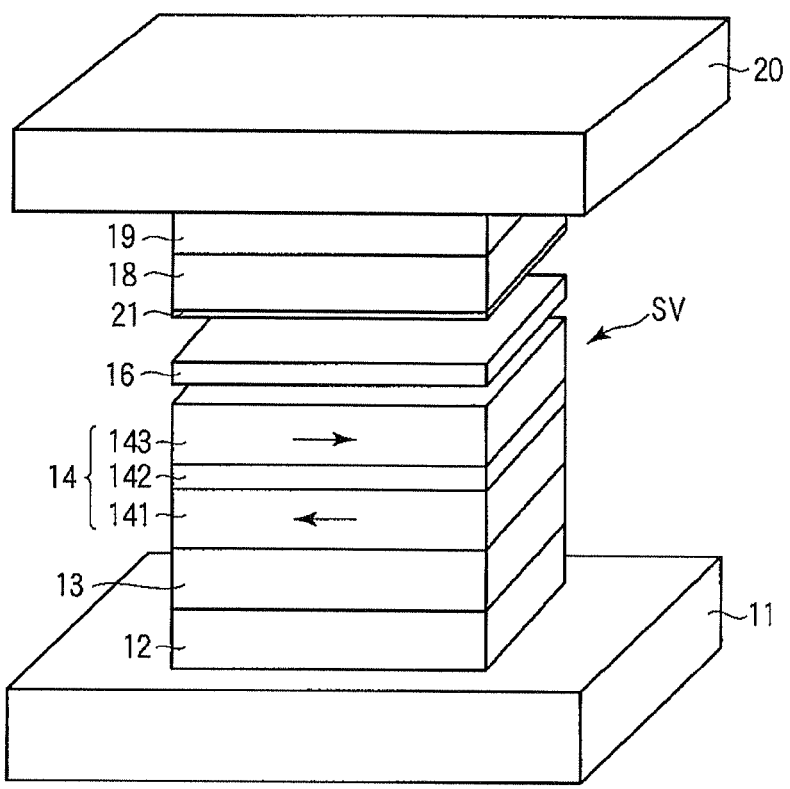
F I G. 21B

MAGNETORESISTIVE ELEMENT AND METHOD OF MANUFACTURING THE SAME

CROSS-REFERENCE TO RELATED APPLICATIONS

This application is based upon and claims the benefit of priority from prior Japanese Patent Application No. 2008-019365, filed Jan. 30, 2008, the entire contents of which are incorporated herein by reference.

BACKGROUND OF THE INVENTION

1. Field of the Invention

The present invention relates to a magnetoresistive element which detects magnetism by passing a sense current in a direction perpendicular to the plane of a magnetoresistive film, and a method of manufacturing the same.

2. Description of the Related Art

At present, magnetic recording apparatuses such as HDD (hard disk drive) are used in applications of personal computers, portable audio/video players, video cameras and car navigation system. A further increase in recording capacity of HDD is desired with the expansion of applications. For increasing recording capacity without increasing the volume of HDD, further improvement in recording density per unit area is needed.

The area of one bit recorded in a magnetic recording medium is decreased with improvement in recording density. As a result, a magnetic field signal from the recording medium becomes very weak to make a conventional read head difficult to distinguish between "0" and "1". Accordingly, a read head having high magnetic field sensitivity is required with improvement in recording density.

The performance of magnetic devices, particularly magnetic heads, has been drastically improved by using the giant magnetoresistive effect (GMR) and tunneling magnetoresistive effect (TMR). Particularly, application of a spin-valve film (SV film) to magnetic heads and magnetic random access memories (MRAMs) has brought about marked technical improvement in the field of magnetic devices.

The "spin-valve film" is a stacked film called a spin-dependent scattering unit having a structure in which a nonmagnetic spacer layer is sandwiched between two ferromagnetic layers. In the spin-valve film, the magnetization of one ferromagnetic layer (referred to as a "pinned layer" or "magnetization pinned layer") is pinned by an antiferromagnetic layer or the like, whereas the magnetization of the other ferromagnetic layer (referred to as a "free layer" or "magnetization free layer") is made rotatable in accordance with an external magnetic field. In the spin-valve film, a giant magnetoresistace change can be produced by a change of the relative angle between the magnetization directions of the pinned layer and the free layer.

Magnetoresistive elements using the spin-valve film include CIP (current-in-plane)-GMR element, CPP (current-perpendicular-to-plane)-GMR element, and TMR (tunneling magnetoresistance) element. In the CIP-GMR element, a sense current is conducted in parallel to the plane of the spin-valve film, and in the CPP-GMR and TMR elements, a sense current is conducted in a direction substantially perpendicular to the plane of the spin-valve film. The trend of high recording density heads is toward the system of conducting a sense current perpendicularly to the plane.

Conventionally, there is known a magnetoresistive element comprising a magnetoresistive film including a pinned layer, a free layer, a spacer layer, and a thin film layer having an oxide, nitride or oxynitride formed in the pinned layer, in the free layer, in the interface between the pinned layer and the spacer layer, or in the interface between the free layer and the spacer layer, and a pair of electrodes that pass a sense current in a direction approximately perpendicular to the plane of the magnetoresistive film. See JP-A 2004-6589 (KOKAI). The thin film layer is permeable preferentially to either up-spin electrons or down-spin electrons, thus contributing to production of higher magnetoresistive ratio (MR ratio). Such thin film layer is called a spin filter layer (SF layer). Even if the SF layer is small in thickness, the SF layer can generate a difference between up-spin electron permeation and down-spin electron permeation and is thus advantageous to narrower head gap.

However, it came to be found that the conventional spin filter layer is insufficient in the difference between up-spin electron permeation and down-spin electron permeation and there is room to enable higher MR ratio.

BRIEF SUMMARY OF THE INVENTION

According to an aspect of the present invention, there is provided a magnetoresistive element comprising:

a magnetoresistive film comprising a magnetization pinned layer a magnetization direction of which is substantially pinned in one direction, a magnetization free layer a magnetization direction of which is varied depending on an external magnetic field, an intermediate layer arranged between the magnetization pinned layer and the magnetization free layer, a cap layer arranged on the magnetization pinned layer or on the magnetization free layer, and a functional layer formed of an oxygen- or nitrogen-containing material and arranged in the magnetization pinned layer, in the magnetization free layer, in an interface between the magnetization pinned layer and the intermediate layer, in an interface between the intermediate layer and the magnetization free layer, or in an interface between the magnetization pinned layer or the magnetization free layer and the cap layer; and a pair of electrodes which pass a current perpendicularly to a plane of the magnetoresistive film, wherein a crystalline orientation plane of the functional layer is different from a crystalline orientation plane of its upper or lower adjacent layer.

According to another aspect of the present invention, there is provided a magnetoresistive element comprising:

a magnetoresistive film comprising a first magnetization free layer a magnetization direction of which is varied depending on an external magnetic field, a second magnetization free layer a magnetization direction of which is varied depending on an external magnetic field, an intermediate layer arranged between the first magnetization free layer and the second magnetization free layer, and a functional layer arranged in the first magnetization free layer, in the second magnetization free layer, in an interface between the first magnetization free layer and the intermediate layer, in an interface between the intermediate layer and the second magnetization free layer, or in an interface of the second magnetization free layer opposite to the interface that is in contact with the intermediate layer; and a pair of electrodes which pass a current perpendicularly to a plane of the magnetoresistive film, wherein a crystalline orientation plane of the functional layer is different from a crystalline orientation plane of its upper or lower adjacent layer.

According to still another aspect of the present invention, there is provided a method of manufacturing a magnetoresistive element comprising a magnetoresistive film comprising a magnetization pinned layer a magnetization direction of which is substantially pinned in one direction, a magnetization free layer a magnetization direction of which is varied depending on an external magnetic field, an intermediate layer arranged between the magnetization pinned layer and the magnetization free layer, a cap layer arranged on the magnetization pinned layer or on the magnetization free layer, and a functional layer formed of an oxygen- or nitrogen-containing material and arranged in the magnetization pinned layer, in the magnetization free layer, in an interface between the magnetization pinned layer and the intermediate layer, in an interface between the intermediate layer and the magnetization free layer, or in an interface between the magnetization pinned layer or the magnetization free layer and the cap layer, and a pair of electrodes which pass a current perpendicularly to a plane of the magnetoresistive film, the method comprising:

repeating two or more modules each comprising depositing a metal layer and exposing the metal layer to either oxygen or nitrogen gas to form the functional layer.

BRIEF DESCRIPTION OF THE SEVERAL VIEWS OF THE DRAWING

FIGS. 1A and 1B are schematic views showing a difference in transmission of conduction electrons in an SF layer between a magnetoresistive element in the prior art and that in the present invention;

FIGS. 2A and 2B are cross-sectional views of magnetoresistive elements according to an embodiment of the present invention;

FIGS. 4A and 4B are cross-sectional views of magnetoresistive elements according to an embodiment of the present invention;

FIG. 6 is a view of an apparatus used in manufacturing a magnetoresistive element according to an embodiment of the present invention;

FIG. 7 is a view showing an example of a conversion treatment chamber in FIG. 6;

FIG. 8 is a graph showing the area resistances (RA) and MR ratios of the magnetoresistive elements in Example 1 and Comparative Examples 1 and 2;

FIG. 12 is a cross-sectional view of a magnetic head according to an embodiment of the present invention;

FIG. 13 is a cross-sectional view of a magnetic head according to an embodiment of the present invention;

FIG. 14 is a perspective view of a magnetic recording apparatus according to an embodiment of the present invention;

FIG. 15 is a perspective view of a magnetic head gimbal assembly according to an embodiment of the present invention;

FIG. 16 is a view showing an example of a matrix structure of a magnetic memory according to an embodiment of the present invention;

FIG. 17 is a view showing another example of a matrix structure of a magnetic memory according to an embodiment of the present invention;

FIGS. 20A and 20B are perspective views of magnetoresistive elements according to embodiments of the present invention;

FIGS. 21A and 21B are perspective views of magnetoresistive elements according to embodiments of the present invention.

DETAILED DESCRIPTION OF THE INVENTION

Figure 3A:
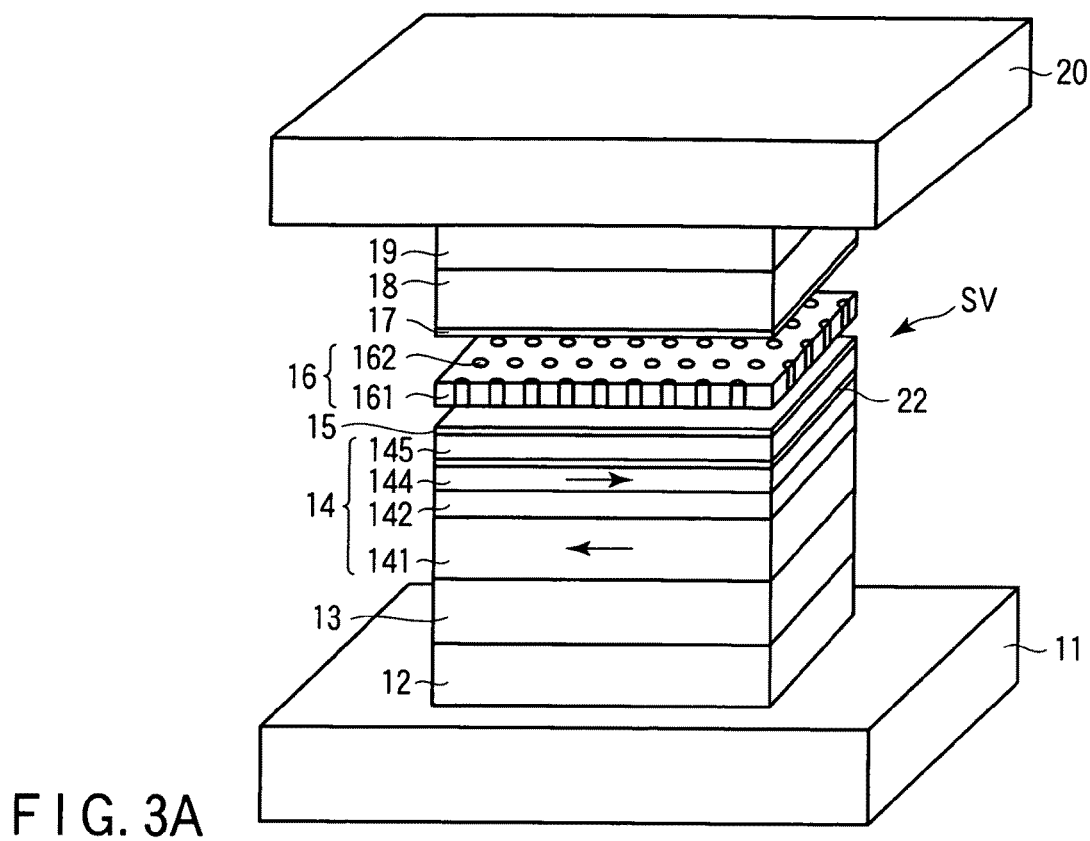
FIGS. 3A and 3B are cross-sectional views of magnetoresistive elements according to an embodiment of the present invention.

The inventors found that a magnetoresistive element in a system of passing a sense current perpendicularly to the plane thereof can realize a high MR ratio by arranging a functional layer, i.e., a spin filter layer or a SF layer, formed of a material selected from the group consisting of an oxide, a nitride and an oxynitride, in a magnetization pinned layer, in a magnetization free layer, in the interface between the magnetization pinned layer and an intermediate layer, in the interface between the intermediate layer and the magnetization free layer, or in the interface between the magnetization pinned layer or the magnetization free layer and a cap layer in which the crystalline orientation plane of the functional layer is different from that of its upper or lower adjacent layer.

The mechanism for this effect is not completely revealed, but is estimated as follows: That is, it is estimated that when the crystalline orientation plane of the SF layer is different from the crystalline orientation plane of its adjacent layer, the transmission probability of conduction electrons through the interface between both the crystalline orientation planes varies depending on spin, to easily attain a spin filter effect.

With reference to FIGS. 1A and 1B, the difference between the prior art and the present invention in respect of the transmission of conduction electrons in the SF layer in the magnetoresistive element is conceptually described. Both the drawings show the state that the SF layer 1 is stacked on its adjacent layer 2. The magnetoresistive element of the present invention includes the case where the adjacent layer 2 is stacked on the SF layer 1. The SF layer 1 is formed of a material selected from the group consisting of an oxide, a nitride and an oxynitride. The adjacent layer 2 is a magnetic layer constituting, for example, a spacer layer, a pinned layer or a free layer. FIG. 1A shows the conventional magnetoresistive element in which the crystalline orientation plane of the SF layer 1 is the same as that of the adjacent layer 2. FIG. 1B shows the magnetoresistive element of the present invention in which the crystalline orientation plane of the SF layer 1 is different from that of the adjacent layer 2. It is assumed that for example any SF layers 1 show a spin filter effect of making up-spin electrons easily transmissible and down-spin electrons hardly transmissible. Of course, there is the opposite case where down-spin electrons are easily transmissible, while up-spin electrons are hardly transmissible.

As shown in FIG. 1A, when the crystalline orientation plane of the SF layer 1 is the same as that of the adjacent layer 2, an effect of blocking down-spin electrons is low, and a spin filter effect can be obtained but is insufficient. As shown in FIG. 1B, on the other hand, when the crystalline orientation plane of the SF layer 1 is different from the crystalline orientation plane of the adjacent layer 2, the effect of blocking down-spin electrons in the interface between both the layers is significant, and the spin filter effect is increased, and the MR ratio is increased, due to the difference in crystalline orientation.

Preferably the reciprocal lattice spots of the crystalline orientation plane of the functional layer and the reciprocal lattice spots of the crystalline orientation plane of its upper or lower adjacent layer are inclined to each other at 10 to 90 degrees.

It is preferable that the functional layer has a crystalline orientation of dispersion angle of 5 degrees or less. Similarly, it is preferable that the magnetization pinned layer or the magnetization free layer has a crystalline orientation dispersion angle of 5 degrees or less.

The inventors also found that the crystalline orientation plane of SF layer can be made different from the crystalline orientation plane of its adjacent layer by improving the method of forming the functional layer (SF layer).

In the conventional method, a metal layer is deposited on an underlayer (adjacent layer) and then subjected to oxidizing, nitriding or oxynitriding treatment (referred to as conversion treatment) to convert the metal layer into an oxide, a nitride or an oxynitride, thereby forming the SF layer. In this method, high conversion energy is not applied to constituent atoms of the metal layer, and thus it is estimated that the crystalline orientation plane of the SF layer becomes the same crystalline orientation plane of the underlayer. Usually, the crystal of the SF layer is oriented such that the SF layer forms crystal lattices in a direction perpendicular to the plane.

In the method of manufacturing a magnetoresistive element according to an embodiment of the invention, the functional layer (SF layer) is formed by repeating two or more modules each comprising depositing a metal layer and converting the metal layer into an oxide, a nitride or an oxynitride. In this case, a thin metal layer is subjected to conversion treatment, so higher conversion energy can be applied to each of atoms in the metal layer, and thus the SF layer having a crystalline orientation plane different from that of the underlayer can be easily formed. The method of manufacturing the magnetoresistive element will be described later in more detail with reference to FIGS. 5A to 5E. As described above, the crystalline form of the SF layer varies significantly according to a difference in the formation method, even if the same metal layer is used.

Hereinafter, the magnetoresistive element according to an embodiment of the invention will be described with reference to the drawings. In this specification, all drawings are schematic illustrations, and the sizes (thickness etc.) of each constituent element and proportions among constituent elements are different from actual ones.

Each of the magnetoresistive elements shown in FIGS. 2A and 2B, FIGS. 3A and 3B, and FIGS. 4A and 4B has a structure in which a lower electrode 11, a magnetoresistive film SV and an upper electrode 20 are stacked on a substrate (not shown).

FIGS. 2A and 2B are perspective views showing examples of a magnetoresistive element having SF layer 21 arranged in a free layer.

The magnetoresistive film SV in FIG. 2A has a structure in which an underlayer 12, a pinning layer 13, a pinned layer 14, a lower metal layer 15, a spacer layer 16, an upper metal layer 17, a free layer 18 and a cap layer 19 are stacked. The pinned layer 14 has a structure in which a lower pinned layer 141, a magnetic coupling layer 142 and an upper pinned layer 143 are stacked. The spacer layer 16 has a current-confined path (CCP) structure including an insulating layer 161 and current paths 162 penetrating the insulating layer 161. The CCP structure including the lower metal layer 15, the spacer layer 16 and the upper metal layer 17 may be assumed as a spacer layer in a broad sense. The free layer 18 has a structure in which a lower free layer 181, an SF layer 21 and an upper free layer 182 are stacked.

The magnetoresistive film SV in FIG. 2B has the same structure as in FIG. 2A except that the spacer layer 16 is formed of a metal layer, and the lower metal layer 15 and the upper metal layer 17 are omitted.

Figure 3B:
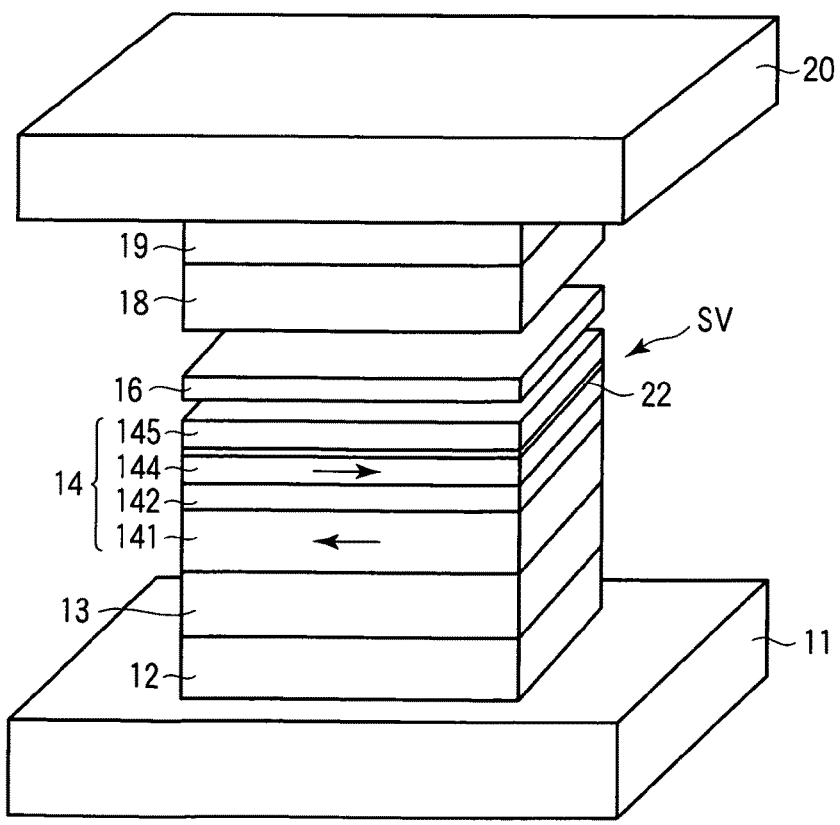

FIGS. 3A and 3B are perspective views showing examples of a magnetoresistive element having an SF layer 22 arranged in an upper pinned layer. In FIG. 3A, a spacer layer 16 has a CCP structure. In FIG. 3B, a spacer layer 16 is formed of a metal layer.

The magnetoresistive film SV in FIG. 3A has the same structure as in FIG. 2A except that the upper pinned layer has a structure in which a first upper pinned layer 144, an SF layer 22 and a second upper pinned layer 145 are stacked, and the free layer 18 is formed of a single magnetic layer.

The magnetoresistive film SV in FIG. 3B has the same structure as in FIG. 3A except that the spacer layer 16 consists of a metal layer, and the lower metal layer 15 and the upper metal layer 17 are omitted.

FIGS. 4A and 4B are perspective views showing examples of a magnetoresistive element having an SF layer 22 arranged in an upper pinned layer and an SF layer 21 arranged in a free layer 18. In FIG. 4A, a spacer layer 16 has a CCP structure. In FIG. 4B, a spacer layer 16 is formed of a metal layer. The other structure is the same as described with reference to FIGS. 2A and 2B and FIGS. 3A and 3B.

Hereinafter, components of the magnetoresistive element will be described.

The lower electrode 11 and the upper electrode 20 are a pair of electrodes for conducting a current in a direction perpendicular to the spin valve film SV. Application of a voltage across the lower electrode 11 and the upper electrode 20 passes a sense current in the spin-valve film along a direction perpendicular to the plane. Magnetism can be sensed by detecting a change in resistance attributable to the magnetoresistive effect by conducting the sense current. As the lower electrode 11, a metal having relatively low electrical resistance, for example NiFe or Cu, is used for conducting a current in the magnetoresistive element.

The underlayer 12 functions as a buffer layer and a seed layer, for example. The buffer layer is a layer for alleviating roughness on the surface of the lower electrode 11. The seed layer is a layer for controlling the crystalline orientation and the crystal grain size of the spin-valve film deposited thereon.

As the buffer layer, Ta, Ti, W, Zr, Hf, Cr or an alloy thereof can be used. The thickness of the buffer layer is preferably approximately 2 nm to 10 nm, more preferably approximately 3 nm to 5 nm. If the buffer layer is too thin, it loses the buffer effect. On the other hand, if the buffer layer is too thick, it increases series resistance that does not contribute to an MR ratio. If the seed layer deposited on the buffer layer has the buffer effect, the buffer layer need not necessarily be formed. A preferable example of the buffer layer includes Ta of about 3 nm in thickness.

The seed layer may be of any material as long as it is possible to control the crystalline orientation of a layer to be deposited thereon. As the seed layer, a metal layer or the like having an fcc structure (face-centered cubic structure), hcp structure (hexagonal close-packed structure) or bcc structure (body-centered cubic structure) is preferable. For example, by using Ru having the hcp structure or NiFe having the fcc structure as the seed layer, the crystalline orientation of the spin-valve film formed thereon can be fcc (111) orientation. Further, the crystalline orientation of the pinning layer 13 such as IrMn can be improved. Besides the materials described above, it is also possible to employ Cr, Zr, Ti, Mo, Nb, W or alloys thereof. For sufficiently exhibiting a function of improving crystalline orientation, the thickness of the seed layer is preferably 1 to 5 nm, more preferably 1.5 to 3 nm. If the seed layer is too thin, effects such as controlling the crystalline orientation will be lost. On the other hand, if the seed layer is too thick, it leads to increase in series resistance, and may further cause irregularity of an interface of the spin-valve film. A preferable example of the seed layer includes Ru of about 2 nm in thickness.

Crystalline orientation of the spin-valve film and the pinning layer 13 can be measured by X-ray diffraction. If half value widths of rocking curves at an fcc (111) peak or bcc (110) peak of the spin-valve film or an fcc (111) peak of the pinning layer 13 (IrMn) is 3.5 degrees to 6 degrees, favorable crystalline orientation can be obtained. The orientation dispersion angle can also be determined from a diffraction spot using a cross-sectional TEM.

As the seed layer, an NiFe-based alloy such as $Ni_xFe_{100-x}$ (x=90% to 50%, preferably 75% to 85%) or $(Ni_xFe_{100-x})_{100-y}X_y$ (X=Cr, V, Nb, Hf, Zr, Mo) prepared by adding a third element X to NiFe so as to be made nonmagnetic can also be used instead of Ru. With the NiFe-based seed layer, a favorable crystalline orientation can be obtained relatively easily, and the half value width of a rocking curve measured in the same manner as described above can be 3 to 5 degrees.

The seed layer has not only the function to improve the crystalline orientation but also the function to control the crystal grain size in the layer formed thereon. The crystal grain size in the layer formed on the seed layer can be determined by cross-sectional TEM or the like. In the case of a bottom-type spin-valve film where the pinned layer 14 is located lower than the spacer layer 16, the crystal grain size of the pinning layer 13 (antiferromagnetic layer) or the pinned layer 14 (magnetization pinned layer) formed on the seed layer is determined.

For a read head adapted to high density recording, an element size is 100 nm or less, for example. When the ratio of the crystal grain size to the element size is high and the number of crystal grains per element area is low, dispersion of element characteristics may be caused and thus a too large crystal grain size is not so favorable. In particular, for the CCP-CPP element having current paths, increasing the crystal grain size is not so favorable. When the crystal grain size is too small, it is generally made difficult to maintain a good crystalline orientation. Accordingly, the crystal grain size of the spin-valve film is preferably in the range of 5 to 40 nm, more preferably in the range of 5 to 20 nm. When the crystal grain size is in this range, a high MR ratio can be realized without dispersion of characteristics even when the size of the magnetoresistive element is reduced.

For attaining a crystal grain size in this range, Ru of about 2 nm in thickness is preferably used as the seed layer. When $(Ni_xFe_{100-x})_{100-y}X_y$ (X=Cr, V, Nb, Hf, Zr, Mo) is used as the seed layer, the composition y of the third element X is preferably about 0 to 30%, including the case of y is 0%.

On the other hand, an element having a size of 100 nm or more is used sometimes in application to MRAM etc., where a crystal grain size as large as 40 nm or so may not be problematic. That is, a large crystal grain size may be used in the seed layer. To increase the crystal grain size to 40 nm or more, it is preferable to use, as a material of the seed layer, an alloy containing a large amount of Cr of about 35 to 45% based on NiFeCr and exhibiting a boundary phase between fcc and bcc or an alloy having a bcc structure.

The pinning layer 13 has a function of imparting unidirectional anisotropy to a ferromagnetic layer serving as a pinned layer 14 to be deposited thereon, thereby pinning magnetization of the ferromagnetic layer. As the material of the pinning layer 13, antiferromagnetic materials such as IrMn, PtMn, PdPtMn and RuRhMn can be used. Among them, IrMn is advantageous for application to heads adapted to high recording density. IrMn can impart unidirectional anisotropy with a thinner film than PtMn and is suitable for reducing a gap necessary for high density recording.

In order to impart sufficiently intense unidirectional anisotropy, the thickness of the pinning layer 13 is set appropriately. When the material of the pinning layer 13 is PtMn or PdPtMn, the thickness thereof is preferably approximately 8 to 20 nm, more preferably 10 to 15 nm. When the material of the pinning layer 13 is IrMn, it is possible to impart unidirectional anisotropy even with a thinner film than PtMn or the like, and the thickness thereof is preferably 3 to 12 nm, more preferably 4 to 10 nm. A preferable example of the pinning layer includes IrMn of about 7 nm in thickness.

As the pinning layer 13, a hard magnetic layer may be used instead of the antiferromagnetic layer. As the hard magnetic layer, for example, CoPt (Co=50 to 85%), $(Co_xPt_{100-x})_{100-y}Cr_y$ (x=50 to 85%, y=0 to 40%), FePt (Pt=40 to 60%) can be used. The hard magnetic layer, particular CoPt, has relatively smaller specific resistance and is thus capable of suppressing increase in series resistance and area resistance RA.

A preferable example of the pinned layer 14 includes a synthetic pinned layer constituted of a lower pinned layer 141 such as $Co_{90}Fe_{10}$ [3.5 nm], a magnetic coupling layer 142 such as Ru, and an upper pinned layer 143 such as ($Fe_{50}Co_{50}$ [1 nm]/Cu [0.25 nm])×2/$Fe_{50}Co_{50}$ [1 nm]. The pinning layer 13 such as IrMn and the lower pinned layer 141 immediately thereon are exchange-coupled so as to have unidirectional anisotropy. The lower pinned layer 141 and the upper pinned layer 143 above and below the magnetic coupling layer 142 are strongly magnetically coupled so that the magnetization directions thereof are in antiparallel to each other.

For example, a $Co_xFe_{100-x}$ alloy (x=0 to 100%) or $Ni_xFe_{100-x}$ alloy (x=0 to 100%), or alloys prepared by adding a nonmagnetic element to the above alloys can be used as the material of the lower pinned layer 141. A single element of Co, Fe, Ni or an alloy thereof may be used as the material of the lower pinned layer 141.

It is preferable that the magnetic thickness, i.e., (saturation magnetization Bs)×(thickness t) or a product of Bs with t of the lower pinned layer 141 is substantially equal to the magnetic thickness of the upper pinned layer 143. Specifically, it is preferable that the magnetic thickness of the upper pinned layer 143 and the magnetic thickness of the lower pinned layer 141 correspond with each other. As an example, when the upper pinned layer 143 is ($Fe_{50}Co_{50}$ [1 nm]/Cu [0.25 nm])×2/$Fe_{50}Co_{50}$ [1 nm], the saturation magnetization of the FeCo in a thin film is approximately 2.2 T, so that the magnetic thickness is 2.2 T×3 nm=6.6 T nm. Since the saturation magnetization of $Co_{90}Fe_{10}$ is approximately 1.8 T, the thickness t of the lower pinned layer 141 which provides the magnetic thickness equal to the above value is 6.6 T nm/1.8

T=3.66 nm. Therefore, it is desirable to use $Co_{90}Fe_{10}$ with a thickness of approximately 3.6 nm. When IrMn is used as the pinning layer 13, the composition of the lower pinned layer 141 preferably has a Fe concentration slightly higher than $Co_{90}Fe_{10}$. Specifically, $Co_{75}Fe_{25}$ or the like is a preferable example.

The thickness of the magnetic layer used for the lower pinned layer 141 is preferably approximately 1.5 to 4 nm. It is based on views of unidirectional anisotropy magnetic field intensity by the pinning layer 13 such as IrMn and antiferromagnetic coupling magnetic field intensity of the lower pinned layer 141 and the upper pinned layer 143 via the magnetic coupling layer 142 such as Ru. If the lower pinned layer 141 is too thin, the MR ratio becomes small. On the other hand, if the lower pinned layer 141 is too thick, it becomes difficult to obtain a sufficient unidirectional anisotropy magnetic field necessary for operating a device. A preferable example is a $Co_{75}Fe_{25}$ with a thickness of 3.6 nm.

The magnetic coupling layer 142 such as Ru has a function of forming a synthetic pinned structure through antiferromagnetic coupling between the upper and lower magnetic layers, i.e., lower pinned layer 141 and upper pinned layer 143. The thickness of an Ru layer as the magnetic coupling layer 142 is preferably 0.8 to 1 nm. Note that any material other than Ru may be used as long as it contributes to sufficient antiferromagnetic coupling between the upper and lower magnetic layers. Instead of the thickness 0.8 to 1 nm corresponding to the second peak of RKKY (Ruderman-Kittel-Kasuya-Yoshida) coupling, a thickness 0.3 to 0.6 nm corresponding to the first peak of the RKKY coupling can also be used. An example is Ru of approximately 0.9 nm in thickness by which stable characteristics can be obtained through more reliable coupling.

A magnetic layer such as $(Fe_{50}Co_{50} [1 nm]/Cu [0.25 nm]) \times 2/Fe_{50}Co_{50} [1 nm]$ can be used as an example of the upper pinned layer 143. The upper pinned layer 143 forms part of a spin-dependent scattering unit. The upper pinned layer 143 is a magnetic layer contributing directly to the MR effect, and its constituent material and thickness are both important for obtaining a high MR ratio. In particular, the magnetic material located at an interface with the spacer layer 16 is important in terms of contribution to spin-dependent interface scattering.

A magnetic material having the bcc structure, for example, is preferably used as the upper pinned layer 143. When a magnetic material having the bcc structure is used as the upper pinned layer 143, it provides a large spin-dependent interface scattering effect, so that a high MR ratio can be realized. The FeCo-based alloy having the bcc structure includes $Fe_xCo_{100-x}$ (x=30 to 100%) and an alloy having an additive element added to $Fe_xCo_{100-x}$. In particular, $Fe_{40}Co_{60}$ to $Fe_{60}Co_{40}$ satisfying various characteristics, and $Fe_{50}Co_{50}$ is a preferable material above all.

When the upper pinned layer 143 is formed of a magnetic layer having the bcc structure with which a high MR ratio is easily realized, the total thickness of this magnetic layer is preferably 1.5 nm or more. This is for keeping the bcc structure stable. Since a metal material used in the spin-valve film often has the fcc or fct structure, it is possible that only the upper pinned layer 143 may be in the bcc structure. Therefore, if the upper pinned layer 143 is too small in thickness, it becomes difficult to keep the bcc structure stable, and the high MR ratio cannot be obtained. The film of $(Fe_{50}Co_{50} [1 nm]/Cu [0.25 nm]) \times 2/Fe_{50}Co_{50} [1 nm]$, which is mentioned as an example of the upper pinned layer 143, is constituted of FeCo with a total thickness of 3 nm and Cu of 0.25 nm layered on every 1 nm of FeCo, with the total thickness of 3.5 nm. On the other hand, the thickness of the upper pinned layer 143 is preferably 5 nm or less. This is for obtaining a large pinned magnetic field. In order to achieve both the large pinned magnetic field and the stability of the bcc structure, the thickness of the upper pinned layer 143 having the bcc structure is preferably about 2.0 to 4 nm.

As the upper pinned layer 143, a $Co_{90}Fe_{10}$ alloy having the fcc structure and a cobalt alloy having the hcp structure, which are widely used in conventional magnetoresistive elements, can be used in place of the magnetic material having the bcc structure. As the upper pinned layer 143, single metals such as Co, Fe and Ni or alloy materials containing any one of them can be used. Magnetic materials for the upper pinned layer 143 include a FeCo alloy material having the bcc structure, a cobalt alloy with a cobalt concentration of 50% or more, and a nickel alloy with a Ni concentration of 50% or more, when arranged in the order from the most advantageous magnetic material for attaining a high MR ratio.

The film of $(Fe_{50}Co_{50} [1 nm]/Cu [0.25 nm]) \times 2/Fe_{50}Co_{50} [1 nm]$ described as an example of the upper pinned layer 143 has magnetic layers (FeCo layers) and nonmagnetic layers (ultrathin Cu layers) stacked alternately. In the upper pinned layer 143 having such a structure, a spin-dependent scattering effect called a spin-dependent bulk scattering effect can be improved by the ultrathin Cu layer.

The "spin-dependent bulk scattering effect" is used as a term in pair with the "spin-dependent interface scattering effect". The spin-dependent bulk scattering effect is a phenomenon that the MR effect is exhibited inside a magnetic layer. The spin-dependent interface scattering effect is a phenomenon that the MR effect is exhibited at the interface between a spacer layer and a magnetic layer.

As shown in FIGS. 3A and 3B, insertion of SF layer 22 into the upper pinned layer has an effect of increasing the MR ratio. The effect of increasing the MR ratio can be expected in both cases where the spacer layer has a CCP structure as shown in FIG. 3A and where the spacer layer is a metal layer as shown in FIG. 3B. The material of SF layer 22 and the method of manufacturing the same will be described later in detail in connection with arrangement of SF layer 21 in the free layer, and thus their detailed description is omitted here.

Hereinafter, improvement in the bulk scattering effect attributable to use of the upper pinned layer having a layered structure of magnetic and nonmagnetic layers will be described.

In the CPP-GMR element having the CCP structure as in FIG. 2A, a current is confined in the vicinity of the spacer layer, and thus contribution of resistance in the vicinity of an interface of the spacer layer is very large. That is, the ratio of the resistance at the interface between the spacer layer 16 and the magnetic layers, i.e., the pinned layer 14 and free layer 18, to the resistance of the entire magnetoresistive element is large. This shows that the contribution of the spin-dependent interface scattering effect is very large in the CCP-CPP element and therefore is important. That is, selection of the magnetic material located at the interface of the spacer layer 16 has very important meaning as compared to the case of a conventional CPP element. This is the reason for using, as the upper pinned layer 143, the FeCo alloy layer having the bcc structure with a large spin-dependent interface scattering effect as described above.

However, use of a material with a large spin-dependent bulk scattering effect is still important for obtaining a higher MR ratio. For obtaining the spin-dependent bulk scattering effect, the thickness of the ultrathin Cu layer is preferably 0.1 to 1 nm, more preferably 0.2 to 0.5 nm. If the thickness of the Cu layer is too thin, the effect of improving the spin-dependent bulk scattering effect becomes weak. If the thickness of the Cu layer is too thick, the spin-dependent bulk scattering effect may decrease, and moreover the magnetic coupling of the upper and lower magnetic layers with the non-magnetic Cu layers interposed therebetween becomes weak, thereby making the characteristics of the pinned layer 14 insufficient. For these reasons, Cu of 0.25 nm in thickness is used in the preferable example of the upper pinned layer.

For the material of the nonmagnetic layer between the magnetic layers in the upper pinned layer 143, Hf, Zr, Ti or the like may be used instead of Cu. When these ultrathin nonmagnetic layers are inserted, the thickness thereof per one magnetic layer such as FeCo is preferably 0.5 to 2 nm, more preferably approximately 1 to 1.5 nm.

As the upper pinned layer 143, a layer made by alloying FeCo and Cu may be used instead of the alternate layered structure of the FeCo layer and the Cu layer. An example of such an FeCoCu alloy is $(Fe_xCo_{100-x})_{100-y}Cu_y$, (x=about 30 to 100%, y=about 3 to 15%), but another compositional range may be used. Here, as an element to be added to FeCo, another element such as Hf, Zr or Ti may be used instead of Cu.

For the upper pinned layer 143, a single layer film made of Co, Fe, Ni or an alloy thereof may be used. For example, as the upper pinned layer 143 with the simplest structure, a $Co_{90}Fe_{10}$ single layer of 2 to 4 nm which has been used widely may be used. To this material, another element may be added.

The spacer layer 16 used is that of CCP structure having an insulating layer 161 and current paths 162 penetrating the insulating layer 161, or that of a metal layer or an all metal layer.

First, the spacer layer, in a broad sense, of the CCP structure including the lower metal layer 15, the spacer layer 16 and the upper metal layer 17 will be described.

The lower metal layer 15 is a remaining layer after used as a source for the current paths 162 and may not remain sometimes in the final structure.

In the spacer layer of CCP structure, the insulating layer 161 is made of oxide, nitride, oxynitride or the like. As the insulating layer 161, both that having an amorphous structure such as $Al_2O_3$ and that having a crystal structure such as MgO can be used. In order to exhibit the function as a spacer layer, the thickness of the insulating layer 161 is preferably in the range of 1 to 3.5 nm, more preferably 1.5 to 3 nm.

It is preferable that the current path has a diameter of 1 nm or more and 7 nm or less in the upper surface of the intermediate layer. The area ratio of the current path in the upper surface of the intermediate layer varies the area resistance RA of the element. As the area ratio of the current path becomes larger, the resistance against the current flowing in the perpendicular direction to the film plane is lowered, which reduces the area resistance RA. As the area ratio of the current path becomes smaller, the resistance against the current flowing in the perpendicular direction to the film plane is raised, which increases the area resistance RA. In view of high transmission rate, it is desirable to reduce the area resistance RA as the recording density is raised, as described later.

A typical material used for the insulating layer 161 includes $Al_2O_3$ and $Al_2O_3$ to which an additive element is added. By way of example, $Al_2O_3$ of about 2 nm in thickness can be used. The additive element includes Ti, Hf, Mg, Zr, V, Mo, Si, Cr, Nb, Ta, W, B, C, V, and the like. The addition amount of the additive element can be varied appropriately in the range of approximately 0 to 50%.

For the insulating layer 161, Ti oxide, Hf oxide, Mg oxide, Zr oxide, Cr oxide, Ta oxide, Nb oxide, Mo oxide, Si oxide, and V oxide can be used instead of the Al oxide such as $Al_2O_3$. Also in the case of these oxides, the above materials can be used as additive elements. The addition amount of the additive element can be varied appropriately in the range of approximately 0 to 50%.

Instead of these oxides, nitrides or oxynitrides based on Al, Si, Hf, Ti, Mg, Zr, V, Mo, Nb, Ta, W, B, and C as described above may be used for the insulating layer 161.

The current paths 162 form confinement paths or routes for passing a current perpendicularly to the plane of the spacer layer 16, and are formed of a metal such as Cu. When the spacer layer 16 uses a CCP structure, the MR ratio can be increased through the current-confined effect. Materials of the current paths 162 include Au, Ag, Al, Ni, Co, Fe, and an alloy including at least one of these elements, besides Cu. Examples of Cu-containing alloys include CuNi, CuCo, and CuFe. An alloy having a composition containing 50% or more of Cu is preferably used to increase the MR ratio and to reduce an interlayer coupling field (Hin) between the pinned layer 14 and the free layer 18.

The material for forming the current paths 162 can also be used in a spacer layer of a metal layer or an all metal layer. In particularly, the all-metal spacer layer is formed preferably of an element selected from the group consisting of Au, Ag and Cu. The thickness of the all-metal spacer layer is preferably about 1.5 to 3 nm.

The current paths 162 are regions having significantly smaller contents of oxygen and nitrogen, in which a difference in the ratio of oxygen and nitrogen content is a half or less, as compared with the insulating layer 161, and are generally in a crystal phase. The crystal phase has lower resistance than an amorphous phase and is thus preferable as the current paths 162.

The upper metal layer 17 constitutes a part of a spacer layer in a broad sense. The upper metal layer 17 has a function as a barrier layer for preventing the free layer 18 deposited thereon from being oxidized upon contacting with oxides in the spacer layer 16, and a function of improving the crystallinity of the free layer 18. If the material of the insulating layer 161 is amorphous, for example, as the case of $Al_2O_3$, the metal layer deposited thereon has poor crystallinity. Thus, by arranging a layer which makes fcc crystallinity favorable, for example, a Cu layer that may be about 1 nm or less in thickness for the upper metal layer 17, the crystallinity of the free layer 18 can be improved significantly.

The upper metal layer 17 need not necessarily be provided depending on the material of the spacer layer 16 or the material of the free layer 18. The metal layer 17 on the spacer layer 16 can be made unnecessary if degradation of crystallinity can be avoided by optimization of anneal conditions, selection of the insulating material in the spacer layer 16, and selection of the material in the free layer 18.

In consideration of margin in manufacturing, it is practically preferable to form the upper metal layer 17 on the spacer layer 16 when the CCP structure is used. A preferable example of the upper metal layer 17 includes Cu of about 0.5 nm in thickness.

Instead of Cu, it is possible to use Au, Ag, or Ru as a material for the upper metal layer 17. The material for the upper metal layer 17 is preferably the same as that for the current paths 162 in the spacer layer 16. If different materials are used for the upper metal layer 17 and for the current paths 162, the interface resistance increases. However, this is prevented if the same material is used for both components.

The thickness of the upper metal layer 17 is preferably 0 to 1 nm, more preferably 0.1 to 0.5 nm. The excessively large thickness of the upper metal layer 17 extends a current confined by the spacer layer 16 to make the current confined effect insufficient, resulting in lowering of the MR ratio.

The spacer layer 16 need not necessarily have the CPP structure, but it may be a metal layer (all-metal layer) not containing the insulating layer. In this case, the spacer layer 16 may preferably be formed of a metal element selected from the group consisting of Au, Ag, Cu, and Cr. The all-metal spacer layer may preferably have a thickness from about 1.5 nm to 3 nm.

The free layer 18 is a layer containing a ferromagnetic material whose magnetizing direction is varied by an external magnetic field. For example, each of the magnetoresistive elements in FIGS. 2A and 2B is provided with an SF layer 21 having a spin filter effect and made of an oxide, a nitride or an oxynitride as a part of the free layer 18 and can realize a higher MR ratio without increasing the thickness. The metal material converted into the SF layer made of an oxide, a nitride or an oxynitride includes elementary metals such as Fe, Co, Ni, Mn and Cr, alloys thereof, and nonmagnetic elements such as Si, Al, Mg, Zr, W, V, Hf, Ta, Ir, Au, Ag, Pt and Nb. In particular, the nitride or oxynitride is preferable because low resistance and improvement in MR ratio can be easily attained. More specifically, metal nitrides or oxynitrides containing magnetic elements such as Fe, Co, Ni, Mn and Cr, or elements tends to exhibit magnetism are preferable.

In the embodiments, the crystalline orientation plane of the SF layer 21 is different from that of its adjacent layer. For example, in FIG. 2B, the crystalline orientation plane of the SF layer 21 (and the lower free layer 181 directly below the SF layer 21) is different from the crystalline orientation plane of underlying Cu spacer layer 16. Since the spacer layer 16 and the SF layer 21 are different in crystalline orientation in the interface thereof, the spin filter effect can become more significant in the interface to realize a magnetoresistive element that can detect a magnetic field highly sensitively.

As shown in FIGS. 3A and 3B, the SF layer 22 may be arranged in the upper pinned layer, and as shown in FIG. 4A and 4B, the SF layer 21 may be arranged in the free layer 18 and also the SF layer 22 may be arranged in the upper pinned layer. A plurality of SF layers may be arranged in the free layer or in the pinned layer. Alternatively, the SF layer may be arranged in the interface between the pinned layer 14 and the spacer layer 16, in the interface between the spacer layer 16 and the free layer 18, or in the interface between the free layer 18 and the cap layer 19.

The cap layer 19 has a function of protecting the spin valve film. The cap layer 19 can be a plurality of metal layers, for example, a two-layer structure of a Cu layer and an Ru layer (Cu [1 nm]/Ru [10 nm]). Further, as the cap layer 19, a Ru/Cu layer in which Ru is arranged on the side of the free layer 18 can also be used. In this case, the thickness of Ru is preferably approximately 0.5 to 2 nm. The cap layer 19 of this structure is desirable especially when the free layer 18 is constituted of NiFe. This is because it can reduce magnetostriction in an interface mixing layer formed between the free layer 18 and the cap layer 19 since Ru is insoluble with Ni.

When the cap layer 19 is either of Cu/Ru or Ru/Cu, the thickness of the Cu layer is preferably approximately 0.5 to 10 nm, and the thickness of the Ru layer is preferably approximately 0.5 to 5 nm. Since Ru has a high specific resistance value, use of an excessively thick Ru layer is not favorable.

As the cap layer 19, a metal layer other than the Cu layer or Ru layer may be provided. For the cap layer 19, another material may be used as long as it can protect the spin-valve film. However, selection of a cap layer may change the MR ratio or the long-term reliability, and therefore care must be taken. Also in these views, Cu and Ru are desirable examples of a material for the cap layer.

For the upper electrode 20, a material with low electrical resistance, for example, Cu, Au or NiFe can be used.

Then, the method of manufacturing a magnetoresistive element according to an embodiment of the invention will be described. FIGS. 5A to 5E are cross-sectional views showing steps for forming an SF layer 21 on a lower free layer 181 in manufacturing the magnetoresistive element in FIG. 2B.

Figure 5A:
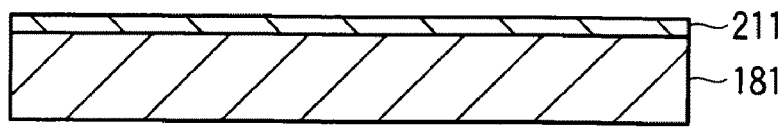
FIGS. 5A to 5E are cross-sectional views showing a method of manufacturing a magnetoresistive element according to an embodiment of the present invention.

As shown in FIG. 5A, a first metal layer 211 to be converted into a SF layer 21 is deposited on the lower free layer 181.

Figure 5B:
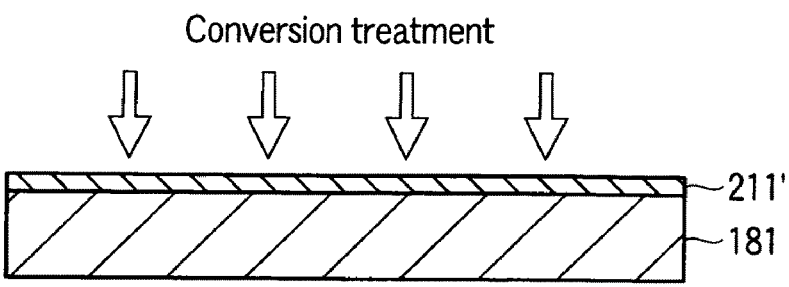

As shown in FIG. 5B, the first metal layer 211 is subjected to conversion treatment by exposure to oxygen or nitrogen gas and formed into a converted layer 211'. The converted layer 211' serves as a part of SF layer 21. In this conversion treatment, conversion into the desired converted layer is not feasible by mere exposure of the surface of the metal layer 211 to a nitrogen or oxygen atmosphere. Conversion treatment should be carried out by exposure to an oxygen or nitrogen gas while atoms of the metal layer are supplied with kinetic energy by ion beam in a nitrogen or oxygen gas atmosphere. In such treatment, energy assist is exerted on atoms of the metal layer. Conversion treatment uniform in the depth direction can be performed by depositing a first metal layer 211 in a small thickness. By this conversion treatment, the crystalline orientation of the converted layer 211' is influenced.

Figure 5C:
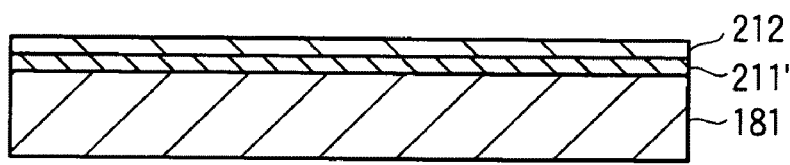

As shown in FIG. 5C, a second metal layer 212 to be converted into the SF layer 21 is deposited again on the converted layer 211'.

Figure 5D:
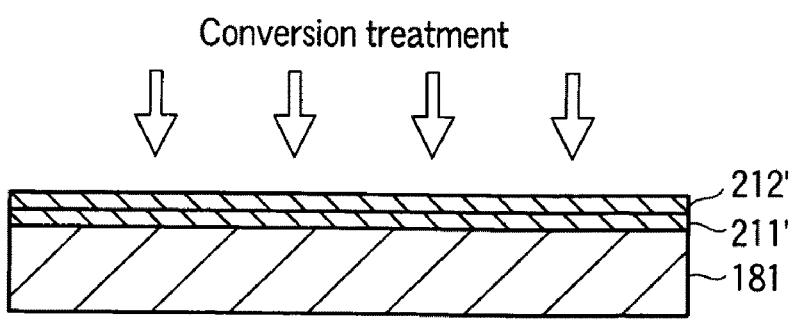

As shown in FIG. 5D, the second metal layer 212 is subjected again to conversion treatment in the same manner as in FIG. 5B, to form a converted layer 212' consisting of an oxide, a nitride or an oxynitride. At this time, not only the conversion of the second metal layer 212 into an oxide, a nitride or an oxynitride but also the conversion of the converted layer 211' just below and further the lower free layer 181 into an oxide, a nitride or an oxynitride may proceed. Since the energy of oxide, nitride or oxynitride formation varies depending on metal material, the depth to which the conversion proceeds depends considerably on the composition and crystal structure of the metal material.

Further, the SF layer 21 is formed by performing modules each including metal layer deposition and conversion treatment repeatedly necessary times that vary depending on the thickness of the SF layer 21 to be finally formed.

Figure 5E:
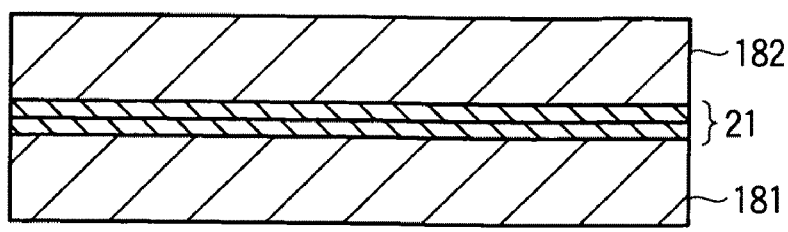

Thereafter, an upper free layer 182 is deposited as shown in FIG. 5E. A free layer 18 containing the lower free layer 181, the SF layer 21 and the upper free layer 182 is formed in this manner. As described above, if the conversion treatment has proceeded such that the lower free layer 181 is influenced, clear distinction between the SF layer 21 and the lower free layer 181 may have disappeared. This case is equivalent to formation of the SF layer 21 in the interface between the spacer layer 16 and the free layer 18 which includes only the upper free layer 182 in this case.

When the SF layer is formed by exposure to nitrogen gas, the number of times N, by which the modules each including metal layer deposition and conversion treatment is repeated when the thickness of the completed SF layer is T nanometers, is determined by the following formula:

$$N \geq (T/0.5) \times x \qquad (1),$$

where x is a constant of 1 to 2, and $T \geq 1$.

The number of times N is varied depending on the thickness of the completed SF layer exposed to nitrogen gas, and determined according to the formula (1) above, to perform a series of manufacturing steps. When the SF layer made of a nitride is to be formed, the conversion thereof into a nitride is made difficult where the same gas flow rate and ion beam energy as in conversion into an oxide are used, because the energy of nitride formation is higher than that of oxide formation. If a metal layer converted into SF layer is deposited to a thickness of greater than 1 nm and subjected to nitriding treatment, a thin nitride layer is merely formed and cannot exhibit the desired effect as the SF layer, thus decreasing an effect of improving the MR ratio. Accordingly, the thickness of the metal layer deposited in one module is preferably 1 nm or less.

The number of times N by which the module is repeated in forming an SF layer containing oxygen is different from the number of times N defined for nitriding treatment, because the SF layer can be formed more easily than an SF layer containing nitrogen. The number of times N, by which the modules each including metal layer deposition and conversion treatment are repeated when the thickness of the completed SF layer is T nanometers, is determined by the following formula:

$$N \geq (T/1) \times x \qquad (2),$$

where x is a constant of 1 to 2, and $T \geq 1$.

The conversion treatment of the metal layer in the depth direction proceeds more easily in the process of exposure to oxygen gas than in the process of exposure to a nitrogen atmosphere. In oxynitriding treatment, SF layer is formed by ion beam irradiation in a mixed atmosphere of oxygen gas and nitrogen gas. When a converted layer of the same thickness is formed by nitriding with nitrogen gas or by oxidation with oxygen gas, the converted layer is formed in oxidation at a lower gas flow rate for a shorter beam irradiation time. Oxynitriding with a mixed gas of oxygen and nitrogen is similar to oxidization from the viewpoint of penetration of the whole gas into a metal layer converted into SF layer. Accordingly, the number of times N by which the module is repeated in oxidation and oxynitriding can be defined by the same formula (2).

The material of each metal layer deposited in FIGS. 5A and 5C is selected from the group consisting of Ni, Fe, Cr, V, Cu, Co, Mn, Hf, Si, Al, Ta, W, Mo, In, Ru, Au, Ag, Pt and Mg.

Particularly as shown in FIGS. 3A and 3B, pinning characteristics (Hua) of the pinned layer are preferably prevented from being reduced when the SF layer 22 is arranged in the upper pinned layer 143. In this case, the formation of SF layer by subjecting a ferromagnetic metal layer selected from Ni, Fe, Co and an alloy thereof to conversion treatment is preferable in that Hua is hardly reduced. Also, it is desirable that two ferromagnetic layers sandwiching the SF layer 22 are ferromagnetically coupled with each other.

If a ferromagnetic metal layer is subjected to conversion treatment to form the SF layer when the SF layer is to be arranged in the free layer, exchange coupling between magnetic moments in the ferromagnetic material is exerted, thereby ferromagnetically coupling the whole of the free layer to cause simultaneous magnetization rotation. Accordingly, a low coercivity (Hc) that is one of the requirements of the free layer can be realized with good controllability.

The thickness of the completed SF layer 21 is preferably about 0.2 nm to 10 nm, and, in particular, the thickness of the completed SF layer 21 exposed to nitrogen gas is preferably about 0.3 to 5 nm. When the SF layer is made of not a nitride but an oxide or an oxynitride, there is a high possibility that the SF layer becomes insulative or extremely highly resistive, and thus the area resistance RA of the element may be significantly increased with increase in thickness. Accordingly, the thickness of the completed SF layer 21 made of an oxide is preferably about 0.3 to 3 nm. The area resistance of a nitride material such as AlN known as an insulating layer is increased with increase in thickness, and thus the SF layer 21 having a thickness near to 10 nm is not practical in manufacturing a magnetoresistive element for low resistant head.

To form a more uniform SF layer, a gas such as argon, xenon, helium, neon or krypton may be made into ion or plasma for the purpose of assisting atomic migration energy, and such ion or plasma atmosphere may be supplied with an oxygen or nitrogen gas to generate an ion and plasma with which the surface of the metal layer is irradiated for conversion treatment.

In formation of the SF layer, it is conceivable to use natural nitriding, natural oxidization or natural oxynitriding by mere exposure of the metal layer to a nitrogen or oxygen atmosphere or an atmosphere of a mixed gas thereof instead of the ion beam-assisted nitriding, oxidization or oxynitriding described above, but for formation of a uniform SF layer, it is preferable to deposit divided metal layers each having a small thickness determined according to the formula (1) or (2). Depending on the intensity of energy given in the process of forming the SF layer by irradiation with nitrogen or oxygen plasma, a crystalline orientation layer that is inclined during epitaxial growth may also be formed.

The area resistance RA of the magnetoresistive element including the SF layer is preferably 0.5 $\Omega \cdot \mu m^2$ or less, specifically 0.05 $\Omega \cdot \mu m^2$ to 0.3 $\Omega \cdot \mu m^2$.

Hereinafter, beam conditions for forming the SF layer will be described. When a rare gas is made into ion or plasma as described above in forming the SF layer by nitriding treatment, it is preferable that the acceleration voltage V is set at +30 to 130 V and the beam current Ib at 20 to 200 mA. These conditions are extremely weaker than those for performing ion beam etching. In place of ion beam, plasma such as RF plasma can be similarly used to form the SF layer. The incident angle of the ion beam can be varied between 0 to 80° where the incident angle is defined to be 0° when the beam is perpendicular to the plane upon incidence and to be 90° when the beam is parallel to the plane upon incidence. The treatment time for this step is preferably 15 to 180 seconds and more preferably 30 seconds or more in terms of controllability and the like. A too long time is not preferable because productivity for CPP elements is reduced. From these viewpoints, the treatment time is most preferably 30 to 180 seconds.

When ion or plasma is used in forming SF layer by oxidizing treatment, it is preferable that the acceleration voltage V is set at about +40 to 200 V and the beam current Ib at about 30 to 300 mA. The oxidizing treatment time is preferably about 15 to 300 seconds, more preferably about 20 seconds to 180 seconds. When an intense ion beam is used, the treatment time is decreased, while when a weak ion beam is used, the treatment time is increased.

In the case of nitriding treatment with ion or plasma, the amount of nitrogen exposure is preferably 1,000 to 10,00.0,000 L (1 L=1×10$^{-6}$ Torr×sec). In the case of oxidation and oxynitriding, the amount of oxygen exposure is preferably 1000 to 5000 L.

By using the above-described appropriate conditions in each of the steps in FIG. 5, an ideal SF layer can be realized.

The first metal layer 211 and the second metal layer 212 deposited separately in FIGS. 5A and 5C may be made of the same material or different materials. Generally, the same material is often used, but use of the same material is not always necessary. Specifically, it is preferable that the spin state is modulated and conductive property is maintained in an SF layer formed by oxidizing or nitriding a metal layer selected from the group consisting of Ni, Fe, Cr, V, Cu, Co, Mn, Hf, Si, Al, Ta, W, Mo, In, Ru, Au, Ag, Pt and Mg.

FIG. 6 is a schematic view showing a deposition apparatus used for manufacturing the magnetoresistive element according to an embodiment of the invention. As shown in FIG. 6, a load lock chamber 51, a pre-cleaning chamber 52, a first metal deposition chamber (MC1) 53, a second metal deposition chamber (MC2) 54, and a conversion treatment chamber 60 are provided via vacuum valves respectively with a transfer chamber (TC) 50 located in the center. In this deposition apparatus, a substrate can be transferred in vacuum between respective chambers connected via the vacuum valves, so that the surface of the substrate is kept clean.

The metal deposition chambers 53, 54 have multiple (5 to 10) targets. Examples of the deposition method include sputtering such as DC magnetron sputtering and RF magnetron sputtering, ion beam sputtering, vacuum evaporation, CVD (chemical vapor deposition), MBE (molecular beam epitaxy), and the like. In the conversion treatment, a chamber having an ion beam mechanism, an RF plasma mechanism or a heating mechanism can be used and should be separated from the metal deposition chamber.

The ultimate degree of vacuum in the vacuum chamber is typically in the order of $10^{-9}$ Torr, and a degree of vacuum in first half of $10^{-8}$ Torr is also acceptable. Specifically, the ultimate degree of vacuum in the metal deposition chamber is preferably $1\times10^{-8}$ Torr or lower and is generally in the range of about $5\times10^{-10}$ to $5\times10^{-9}$ Torr. The ultimate degree of vacuum in the transfer chamber 50 is in the order of $10^{-9}$ Torr. The ultimate degree of vacuum in the conversion treatment chamber 60 is desirably $8\times10^{-8}$ Torr or less.

Deposition of a metal layer to be converted into the SF layer is conducted in either the metal deposition chamber 53 or 54. The conversion treatment is carried out in the conversion treatment chamber 60. After deposition of a metal layer, the substrate is transferred via the transfer chamber 50 to the conversion treatment chamber 60 where the substrate is subjected to conversion treatment. Thereafter, the substrate is transferred to either the metal deposition chamber 53 or 54 where a second metal layer is deposited, and the substrate is transferred again via the transfer chamber 50 to the conversion treatment chamber 60 where the substrate is subjected to conversion treatment.

FIG. 7 shows an example of the conversion treatment chamber 60 in FIG. 6. The conversion treatment chamber 60 uses an ion beam. As shown in FIG. 7, the conversion treatment chamber 60 is evacuated by a vacuum pump 61, and a reaction gas whose flow rate is controlled by a mass flow controller (MFC) 63 is introduced into the conversion treatment chamber 60 through a conduit 62. An ion source 70 is provided in the conversion treatment chamber 60. Types of the ion source include an inductive coupled plasma (ICP) type, a capacitive coupled plasma type, an electron-cyclotron resonance (ECR) type, and a Kauffman type. A substrate holder 80 is arranged opposite to the ion source 70, and a substrate 1 is arranged thereon.

Three grids 71, 72, and 73 are provided at an ion emission port of the ion source 70 to adjust ion acceleration. A neutralizer 74 is provided outside the ion source 70 to neutralize ions. The substrate holder 80 is supported so as to be freely tilted. The angle at which ions are incident on the substrate 1 can be varied over a wide range. A typical incident angle ranges between 15° to 60°.

In the conversion treatment chamber 60, energy assist for the conversion treatment with ion can be performed by irradiating the substrate 1 with an ion beam such as Ar, and the metal layer can be converted into SF layer by irradiating the substrate 1 with an ion beam such as Ar while supplying the chamber 60 with a reaction gas from the conduit 62.

An RF plasma chamber or the like may be used as the conversion treatment chamber. Anyway, conversion treatment shall be conducted in a chamber wherein an ion or plasma can be generated to give energy in the conversion treatment.

As a means of giving energy, heat treatment may be conducted. In this case, heat treatment at a temperature of 100 to 300° C. for several tens of seconds to a few minutes, for example, may be conducted.

Hereinafter, the method of manufacturing the magnetoresistive element shown in FIGS. 2A and 2B will be described entirely.

(1) Formation of the Underlayer 12

The lower electrode 11 is formed in advance on the substrate (not shown) by a micro-fabrication process. As the underlayer 12, for example Ta [5 nm]/Ru [2 nm] is deposited on the lower electrode 11. Ta is a buffer layer for alleviating roughness on the surface of the lower electrode. Ru is a seed layer for controlling the crystalline orientation and crystal grain size of the spin-valve film deposited thereon.

(2) Formation of the Pinning Layer 13

The pinning layer 13 is deposited on the underlayer 12. As a material of the pinning layer 13, an antiferromagnetic material such as PtMn, PdPtMn, IrMn or RuRhMn can be used.

(3) Formation of the Pinned Layer 14

The pinned layer 14 is formed on the pinning layer 13. The pinned layer 14 can be a synthetic pinned layer of a lower pinned layer 141 ($Co_{90}Fe_{10}$), a magnetic coupling layer 142 (Ru), and an upper pinned layer 143 ($Co_{90}Fe_{10}$), for example.

(4) Formation of the Spacer Layer

Next, the spacer layer is formed. The spacer layer may be one which has a CCP structure as shown in FIG. 2A, or may be a metal layer as shown in FIG. 2B.

The spacer layer having a CCP structure can be formed by a method disclosed in, for example, JP-A 2006-54257 (KOKAI). The spacer layer made of a metal layer can be formed by depositing Cu, Au, Ag, Cr or Mn in the metal deposition chamber.

(5) Formation of the Free Layer

Then, the free layer 18 including the SF layer 21 is formed according to the method described with reference to FIGS. 5A to 5E.

(6) Formation of the Cap Layer 19 and Upper Electrode 20

As the cap layer 19, Cu [1 nm] and Ru [10 nm], for example, are deposited on the free layer 18. On the cap layer 19, the upper electrode 20 for conducting a current perpendicularly to the spin-valve film is formed.

EXAMPLES

Example 1

The magnetoresistive element shown in FIG. 2B was prepared in this examples. The magnetoresistive element in Example 1 is structured as follows:
Lower electrode 11
Underlayer 12: Ta [1 nm]/Ru [2 nm]
Pinning layer 13: $Ir_{22}Mn_{78}$ [7 nm]
Pinned layer 14: $Co_{90}Fe_{10}$ [4 nm]/Ru [0.85 nm]/$Co_{90}Fe_{10}$ [4 nm]
Spacer layer (all metal) 16: Cu [3 nm]
Lower free layer 181: $Co_{90}Fe_{10}$ [2 nm]
SF layer 21: (Nitride of $Fe_{80}Co_{20}$ [0.4 nm])×5 layers prepared by the method in FIGS. 5A to 5E
Upper free layer 182: $Co_{90}Fe_{10}$ [2 nm]

Cap layer 19
Upper electrode 20.

Now, a method of forming the free layer including the SF layer after the layers to the spacer layer 16 are deposited will be described. To produce a usual spin-valve film, layers are stacked to the space layer 16, and then the free layer is deposited in one step. When the free layer including the SF layer such as in this example is formed, a magnetic layer having half the thickness of the usual free layer is deposited and then the SF layer 21 is formed thereon. In this example, $Co_{90}Fe_{10}$ of 2 nm in thickness was deposited as the lower free layer 181.

Then, in the step of FIG. 5A, $Fe_{80}Co_{20}$ of 0.4 nm in thickness was deposited as the first metal layer 211 to be converted into SF layer. In the step of FIG. 5B, the conversion treatment was conducted in the following manner. While the surface of the metal layer is irradiated with an Ar ion beam, nitrogen gas was flowed into the conversion treatment chamber. The acceleration conditions for Ar ion beam was set to 60 V. In this manner, a first ultrathin nitride layer 211' was formed. The flow of nitrogen gas is stopped, and the substrate was transferred to the metal deposition chamber. In the step of FIG. 5C, $Fe_{80}Co_{20}$ of 0.4 nm in thickness was deposited as the second metal layer 212 to be converted into SF layer. In the step of FIG. 5D, the second metal layer 212 was subjected to conversion treatment. The conditions for this conversion treatment were the same as the nitriding conditions in FIG. 5B. In this manner, a second ultrathin nitride layer 212' was formed. The processes of such metal layer deposition and nitriding treatment were repeated 5 times in total, whereby the SF layer 21 made of a nitride layer of $Fe_{80}Co_{20}$ having a final thickness of 2 nm was formed.

After formation of the SF layer 21 was completed, the substrate was transferred to the metal deposition chamber, and the upper free layer and the cap layer were deposited. Because the CPP element to be produced has a final layer structure by heat treatment conducted after deposition of all layers, the CPP element may not have the final layer structure in the stage of film deposition. Actually, the heat treatment conducted after deposition of films to the cap layer also shows the energy assist effect. This heat treatment was carried out at 280° C. for 4 hours.

Comparative Example 1

A magnetoresistive element having a free layer 18 made of $Co_{90}Fe_{10}$ of 4 nm in thickness and not including an SF layer was prepared in Comparative Example 1. The structure of the magnetoresistive element in Comparative Example 1 is as follows:
Lower electrode 11
Underlayer 12: Ta [1 nm]/Ru [2 nm]
Pinning layer 13: $Ir_{22}Mn_{78}$ [7 nm]
Pinned layer 14: $Co_{90}Fe_{10}$ [4 nm]/Ru [0.85 nm]/$Co_{90}Fe_{10}$ [4 nm]
Spacer layer (all metal) 16: Cu [3 nm]
Free layer 18: $Co_{90}Fe_{10}$ [4 nm]
Cap layer 19
Upper electrode 20.

Comparative Example 2

A magnetoresistive element having the same layer structure as in Example 1 was prepared in Comparative Example 2 by performing a module consisting of metal layer deposition and nitriding treatment only once to form an SF layer in a free layer.

Lower electrode 11
Underlayer 12: Ta [1 nm]/Ru [2 nm]
Pinning layer 13: $Ir_{22}Mn_{78}$ [7 nm]
Pinned layer 14: $Co_{90}Fe_{10}$ [4 nm]/Ru [0.85 nm]/$Co_{90}Fe_{10}$ [4 nm]
Spacer layer (all metal) 16: Cu [3 nm]
Lower free layer 181: $Co_{90}Fe_{10}$ [2 nm]
SF layer 21: Nitride layer prepared by depositing $Fe_{80}Co_{20}$ [1 nm] and nitriding it only once under the same conditions as in Example 1
Upper free layer 182: $Co_{90}Fe_{10}$ [2 nm]
Upper electrode 20.

Characteristics of the thus prepared magnetoresistive elements in Example 1 and Comparative Examples 1 and 2 were evaluated. The area resistance and MR ratio of each element were measured by passing a current from the pinned layer 14 to the free layer 18 where the flow of electrons is from the free layer 18 to the pinned layer 14. When a current is passed from the free layer 18 to the pinned layer 14 where the flow of electrons is from the pinned layer 14 to the free layer 18, the noise by spin transfer torque effect is increased. Therefore, the current is passed preferably from the pinned layer 14 to the free layer 18 as described above to reduce the spin transfer noise.

FIG. 8 shows the area resistances (RA) and MR ratios of the magnetoresistive elements in Example 1 and Comparative Examples 1 and 2. In the element in Example 1, RA is 0.1 $\Omega\mu m^2$, and MR ratio is 1.1%. In both the elements in Comparative Examples 1 and 2, RA is about 0.08 $\Omega\mu m^2$, and MR ratio is about 0.8%. It was thus recognized that the element in Example 1 shows a significantly higher MR ratio than by the elements in Comparative Examples 1 and 2.

Then, cross-sectional transmission electron microscopic (cross-sectional TEM) images of the elements in Example 1 and Comparative Example 2 were compared.

Figure 9:
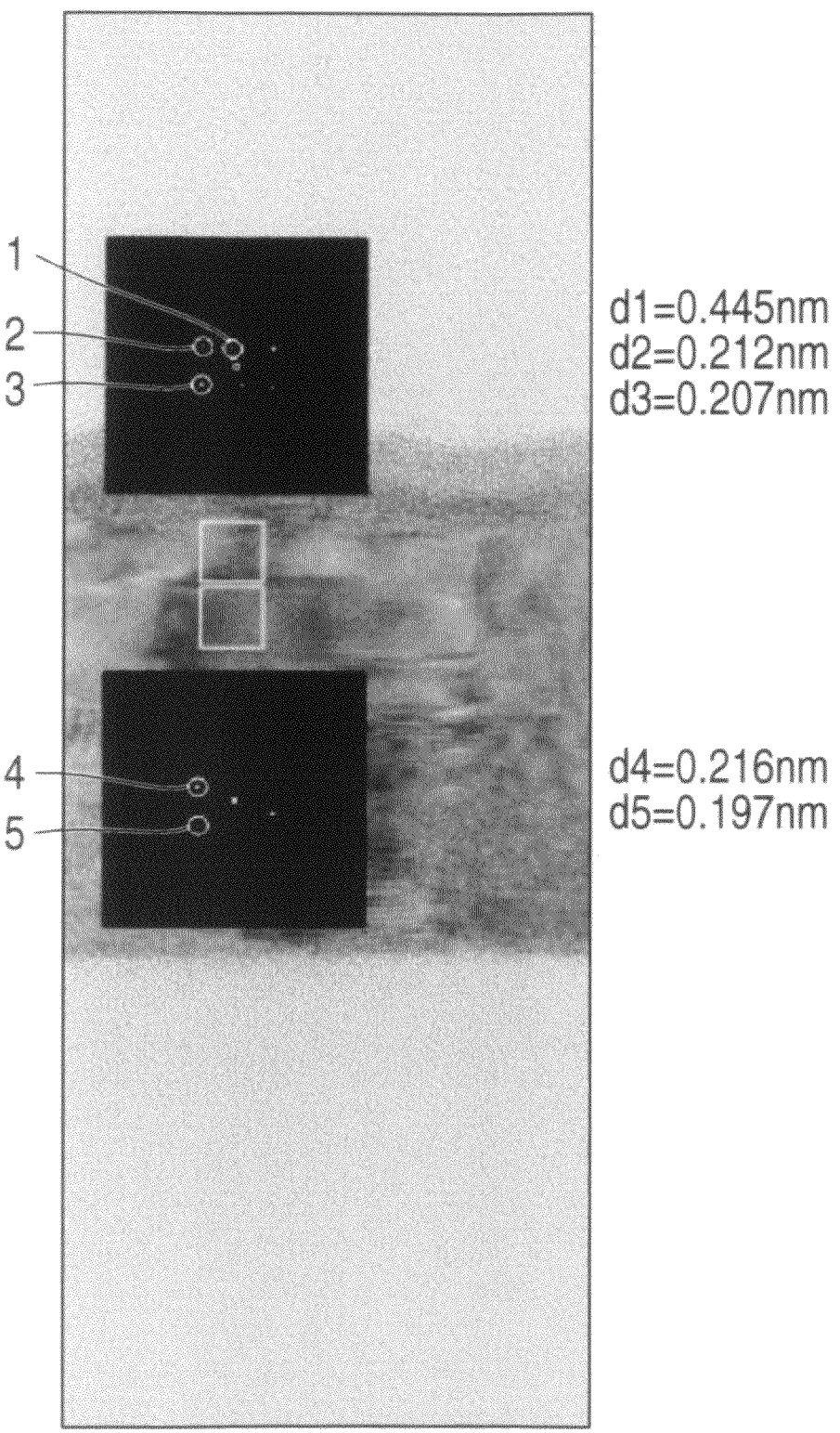
FIG. 9 is a diagram showing a cross-sectional TEM image of a magnetoresistive film prepared by the same method as in Example 1.

FIG. 9 shows a cross-sectional TEM image of a magnetoresistive film prepared in the same manner as in Example 1. In this figure, the lower magnified view shows the spacer layer 16, and the upper magnified view shows the lower free layer 181 (and the SF layer 21). From this figure, it was found that the crystalline orientation plane of the spacer layer 16 and the crystalline orientation plane of the lower free layer 181 are different from each other at their interface as the boundary. The region showing the upper crystalline orientation plane includes the portion corresponding to the lower free layer and the portion corresponding to the SF layer formed of (nitride of $Fe_{80}Co_{20}$ [0.4 nm])×5 layers. Although not shown in this figure, the crystalline orientation plane in the upper region and the crystalline orientation plane of the portion corresponding to the upper free layer thereon are different from each other.

Figure 10A:
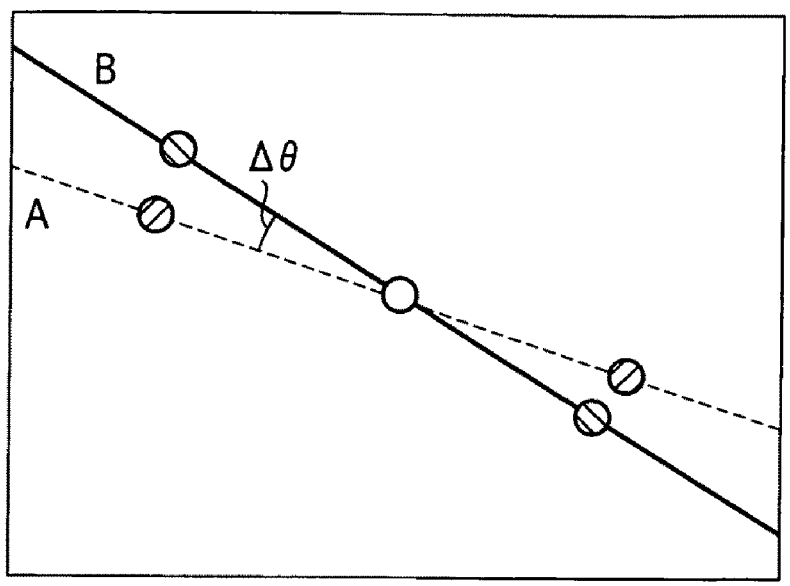
FIGS. 10A and 10B are diagrams on which reciprocal lattice spots of the spacer layer and reciprocal lattice spots of the SF layer in FIG. 9 are superimposed.
Figure 10B:
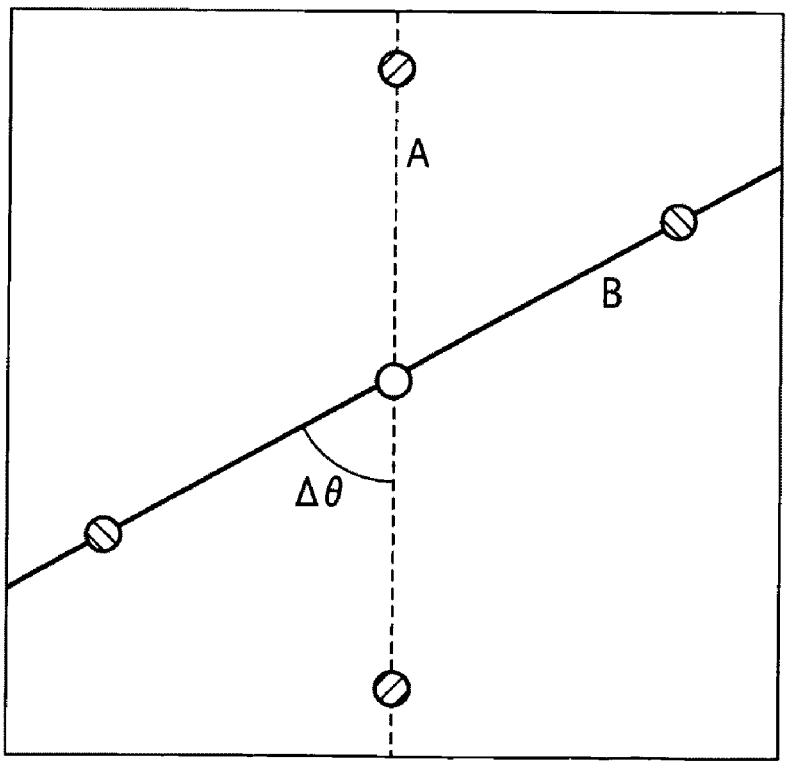

The cross section in FIG. 9 was subjected to fast Fourier transformation (FFT) to give reciprocal lattice spots of the crystalline orientation plane. FIGS. 10A and 10B show graphs in which reciprocal lattice spots of the spacer layer 16 and reciprocal lattice spots of the SF layer 21 (and the lower free layer 181) were superimposed with a spot in the [001] direction as the center.

FIG. 10A shows reciprocal lattice spots of the crystalline orientation planes of the layers, which were considered equivalent with almost the same distance between the central spot and the reciprocal lattice spot, i.e., 0.212 nm for the spacer layer 16 or 0.216 nm for the SF layer 21. A is a straight line connecting reciprocal lattice spots of the spacer layer 16, and B is a straight line connecting reciprocal lattice spots of the SF layer 21. In this figure, the lines A and B are at an angle $\Delta\theta$ of about 12 degrees, and the crystalline orientation planes of the upper and lower layers are inclined to each other at this angle. Here, in the case where at least two spots passing through the center of a circle in measurement of reciprocal lattice spots are obtained on the same diagonal line, a line is drawn between them to calculate Δθ. The two spots in this case can be obtained from the same crystalline orientation and are thus almost the same in the distance from the central point. An acute angle between a line of reciprocal lattice spots of the SF layer and a line of reciprocal lattice spots of its adjacent layer is defined as Δθ. That is, the angle of two lines passing through the center of a circle is defined as Δθ, and thus Δθ in this definition is 90 degrees at a maximum.

FIG. 10B shows results of measurement at different points of the same sample. The crystalline orientation varies in the plane, and thus the respective crystal grains give different results, so measurement at different points is also conducted. Reciprocal lattice spots of crystalline orientation planes considered equivalent with almost the same distance between the central spot and the reciprocal lattice spot, i.e., 0.208 nm for the spacer layer 16 or 0.214 nm for the SF layer 21 are shown. A is a straight line connecting reciprocal lattice spots of the spacer line 16, and B is a straight line connecting reciprocal lattice spots of the SF layer 21. In this figure, the lines A and B are at an angle of Δθ=about 60 degrees, and the crystalline orientation planes of the upper and lower layers are inclined to each other at this angle.

Figure 11:
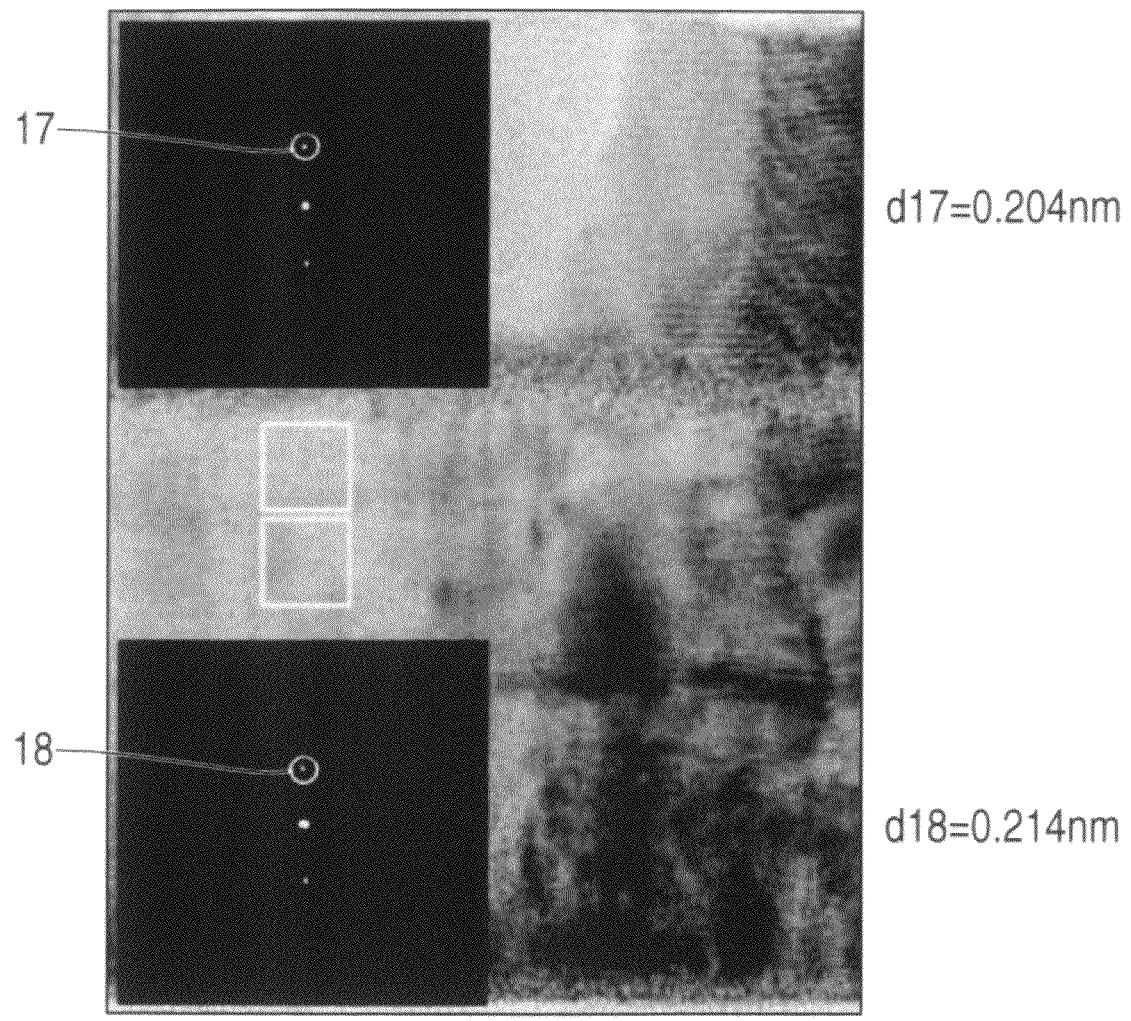
FIG. 11 is a diagram showing a cross-sectional TEM image of a magnetoresistive film prepared by the same method as in Comparative Example 2.

FIG. 11 shows a cross-sectional TEM image of a magnetoresistive film prepared in the same manner as in Comparative Example 2. From this figure, crystalline orientation planes of the spacer layer 16, the lower free layer 181, the SF layer 21 and the upper free layer 181 coincide with one another, indicating epitaxial growth. The cross section in FIG. 11 was subjected to fast Fourier transformation (FFT) in an analogous manner as described above to give reciprocal lattice spots of the crystalline orientation plane. When a diagram wherein reciprocal lattice spots of the spacer layer 16 were superimposed on reciprocal lattice spots of the SF layer 21 was prepared (not shown), the inclination Δθ between the crystalline orientation planes of the two layers was almost 0 degree. Regardless of crystal grains, Δθ was 0 degree in every case. That is, there was no inclination between the crystalline orientation planes of the SF layer and the spacer layer, indicating epitaxial growth.

The reason that the above difference was produced between Example 1 and Comparative Example 2 is estimated as follows:

When the process including metal layer deposition and treatment in a nitrogen atmosphere is repeated 5 times to form an SF layer as shown in Example 1, the thickness of the metal layer is sufficiently small per layer, i.e., 0.4 nm in this case. If the thin metal layer is subjected to nitriding treatment with ion or plasma, sufficient energy is supplied to constituent atoms of the metal layer. Accordingly, the SF layer 21 (and the lower free layer 181 just below the SF layer 21) having a crystalline orientation plane inclined to the crystalline orientation plane of the underlying spacer layer 16 is formed. The energy of formation of the upper layer having a crystalline orientation plane inclined to the crystalline orientation plane of the underlying layer is so high that the upper layer is hardly formed by usual treatment.

On the other hand, when a relatively thick metal layer is subjected only once to treatment in a nitrogen atmosphere to form an SF layer as shown in Comparative Example 2, sufficient energy is not supplied to constituent atoms of the metal layer, and thus the effect of converting the surface of the metal layer is low, and the crystalline orientation plane of the SF layer 21 (and the lower free layer 181 just below the SF layer 21) is not declined to the crystalline orientation plane of the underlying spacer layer 16.

In the case where the SF layer 21 (and the lower free layer 181 just below the SF layer 21) having a crystalline orientation plane inclined to the crystalline orientation plane of the underlying spacer layer 16 is formed as in Example 1, either up-spin electrons or down-spin electrons easily penetrate through the interface between the two layers, to produce the spin filter effect. As a result, it is considered that higher MR ratio can be attained in Example 1. This effect agrees with theoretical calculation that the difference in Fermi velocity between up-spin electrons and down-spin electrons contributes to conduction (I. I. Main, Phys. Rev. Lett., 83(7), 1999, p. 1427).

On the other hand, it is considered that when the crystalline orientation plane of the underlying spacer layer 16 agrees with the crystalline orientation plane of the SF layer 21 (and the lower free layer 181 just below the SF layer 21) as in Comparative Example 2, any effect of improving MR ratio cannot be recognized.

If the crystalline orientation planes of the SF layer and its adjacent layer can be inclined by the present process, it is not always necessary that the SF layer contains nitrogen or oxygen. This can apply to the treatment particularly in a nitrogen atmosphere. In this case, the object of the process conducted in a nitrogen atmosphere lies not in forming a nitride, but in allowing the crystalline orientation plane of the layer to be inclined to the adjacent layer.

Example 2

The magnetoresistive element shown in FIG. 3B was manufactured by using the following materials:
Lower electrode 11
Underlayer 12: Ta [1 nm]/Ru [2 nm]
Pinning layer 13: $Ir_{22}Mn_{78}$ [7 nm]
Lower pinned layer 141: $Co_{90}Fe_{10}$ [4 nm]
Antiferromagnetic coupling layer 142: Ru [0.85 nm]
First upper pinned layer 144: $Co_{90}Fe_{10}$ [2 nm]
SF layer 21: (Nitride of $Fe_{80}Co_{20}$ [0.4 nm])×5 layers prepared by the method in FIGS. 5A to 5E
Second upper pinned layer 145: $Co_{90}Fe_{10}$ [2 nm]
Spacer layer (all metal) 16: Cu [3 nm]
Free layer 18: $Co_{90}Fe_{10}$ [4 nm]
Cap layer 19: Cu [1 nm]/Ru [10 nm]
Upper electrode 20.

Example 3

The magnetoresistive element shown in FIG. 3A was manufactured by using the following materials:
Lower electrode 11
Underlayer 12: Ta [1 nm]/Ru [2 nm]
Pinning layer 13: $Ir_{22}Mn_{78}$ [7 nm]
Lower pinned layer 141: $Co_{90}Fe_{10}$ [4 nm]
Antiferromagnetic coupling layer 142: Ru [0.85 nm]
First upper pinned layer 144: $Co_{90}Fe_{10}$ [2 nm]
SF layer 21: (Nitride of $Fe_{80}Co_{20}$ [0.4 nm])×5 layers prepared by the method in FIGS. 5A to 5E
Second upper pinned layer 145: $Co_{90}Fe_{10}$ [2 nm]
Spacer layer (CCP-NOL) 16: $Al_2O_3$ insulating layer 161 and Cu current paths 162
Free layer 18: $Co_{90}Fe_{10}$ [4 nm]
Cap layer 19: Cu [1 nm]/Ru [10 nm]
Upper electrode 20.

Example 4

The magnetoresistive element shown in FIG. 2A was manufactured by using the following materials:
Lower electrode 11
Underlayer 12: Ta [1 nm]/Ru [2 nm]
Pinning layer 13: $Ir_{22}Mn_{78}$ [7 nm]
Pinned layer 14: $Co_{90}Fe_{10}$ [4 nm]/Ru [0.85 nm]/$Co_{90}Fe_{10}$ [4 nm]
Spacer layer (CCP-NOL) 16: $Al_2O_3$ insulating layer 161 and Cu current paths 162
Lower free layer 181: $Co_{90}Fe_{10}$ [2 nm]
SF layer 21: (Nitride of $Fe_{80}Co_{20}$ [0.4 nm])×5 layers prepared by the method in FIGS. 5A to 5E
Upper free layer 182: $Co_{90}Fe_{10}$ [2 nm]
Cap layer 19: Cu [1 nm]/Ru [10 nm]
Upper electrode 20.

Example 5

The magnetoresistive element shown in FIG. 4B was manufactured by using the following materials:
Lower electrode 11
Underlayer 12: Ta [1 nm]/Ru [2 nm]
Pinning layer 13: $Ir_{22}Mn_{78}$ [7 nm]
Lower pinned layer 141: $Co_{90}Fe_{10}$ [4 nm]
Antiferromagnetic coupling layer 142: Ru [0.85 nm]
First upper pinned layer 144: $Co_{90}Fe_{10}$ [2 nm]
SF layer 22: (Nitride of $Fe_{80}Co_{20}$ [0.4 nm])×5 layers prepared by the method in FIGS. 5A to 5E
Second upper pinned layer 145: $Co_{90}Fe_{10}$ [2 nm]
Spacer layer (all metal) 16: Cu [3 nm]
Lower free layer 181: $Co_{90}Fe_{10}$ [2 nm]
SF layer 21: (Nitride layer of $Fe_{80}Co_{20}$ [0.4 nm])×5 layers prepared by the method in FIG. 5
Upper free layer 182: $Co_{90}Fe_{10}$ [2 nm]
Cap layer 19: Cu [1 nm]/Ru [10 nm]
Upper electrode 20.

Example 6

The magnetoresistive element shown in FIG. 4A was manufactured by using the following materials:
Lower electrode 11
Underlayer 12: Ta [1 nm]/Ru [2 nm]
Pinning layer 13: $Ir_{22}Mn_{78}$ [7 nm]
Lower pinned layer 141: $Co_{90}Fe_{10}$ [4 nm]
Antiferromagnetic coupling layer 142: Ru [0.85 nm]
First upper pinned layer 144: $Co_{90}Fe_{10}$ [2 nm]
SF layer 22: (Nitride of $Fe_{80}Co_{20}$ [0.4 nm])×5 layers prepared by the method in FIGS. 5A to 5E
Second upper pinned layer 145: $Co_{90}Fe_{10}$ [2 nm]
Spacer layer (CCP-NOL) 16: $Al_2O_3$ insulating layer 161 and Cu current paths 162
Lower free layer 181: $Co_{90}Fe_{10}$ [2 nm]
SF layer 21: (Nitride of $Fe_{80}Co_{20}$ [0.4 nm])×5 layers prepared by the method in FIGS. 5A to 5E
Upper free layer 182: $Co_{90}Fe_{10}$ [2 nm]
Cap layer 19: Cu [1 nm]/Ru [10 nm]
Upper electrode 20.

These magnetoresistive elements in Examples 2 to 6 can also achieve the same effect as that of the magnetoresistive element in Example 1.

(Application of the Magnetoresistive Element)

Application of the magnetoresistive element according to the embodiments of the present invention will be described below.

In the embodiments of the present invention, the element resistance RA of the CPP element is preferably set to 0.3 $\Omega \cdot \mu m^2$ or less, more preferably 0.15 $\Omega \cdot \mu m^2$ or less, from the viewpoint of compatibility with higher density. The element resistance RA is calculated by multiplying the resistance R of the CPP element by the effective area A of a conductive part of the spin-valve film. In this case, the element resistance R can be directly measured. On the other hand, the effective area A of the conductive part of the spin-valve film has a value dependent on the element structure. Accordingly, attention must be paid to determination of the effective area A.

For example, if the entire spin-valve film is patterned as an effectively sensing part, the effective area A is the area of the entire spin-valve film. In this case, the area of the spin valve film is set to 0.04 $\mu m^2$ or less so as to set an appropriate element resistance.

If a lower electrode 11 or an upper electrode 20 having a smaller area than the spin-valve film is formed in contact with the spin-valve film, the effective area A of the spin-valve film is the area of the lower electrode 11 or upper electrode 20. If the lower electrode 11 and upper electrode 20 have different areas, the area of the smaller electrode is the effective area A of the spin-valve film. In this case, the area of the smaller electrode is set to 0.04 $\mu m^2$ or less so as to set an appropriate element resistance.

The smallest area of the spin-valve film is that of a part where the film is in contact with the upper electrode 20, and thus the width of this part is considered as the track width Tw. The smallest height of the spin-valve film is also that of a part where the film is in contact with the upper electrode 20, and thus the height of this part is considered as the height length D. In this case, the effective area A of the spin-valve film is determined as: A=Tw×D.

In the magnetoresistive element according to the embodiment of the present invention, the resistance R between the electrodes can be set to 100 $\Omega$ or less. The resistance R is a resistance value measured for example between two electrode pads in a reproducing head installed to the tip of a head gimbal assembly (HGA).

The magnetoresistive element according to the embodiment of the present invention desirably has an fcc (111) orientation property if the pinned layer 14 or free layer 18 has the fcc structure. The magnetoresistive element desirably has a bcc (110) orientation property if the pinned layer 14 or free layer 18 has the bcc structure. The magnetoresistive element desirably has an hcp (001) or hcp (110) orientation property if the pinned layer 14 or free layer 18 has the hcp structure.

The crystalline orientation property of the magnetoresistive element according to the embodiment of the present invention preferably has a dispersion angle of 5.0 degrees or less, more preferably 3.5 degrees or less, still more preferably 3.0 degrees or less. This value is obtained by measuring a half value width of a rocking curve at a peak position obtained by θ-2θ measurement in X-ray diffraction. This value can be detected as a dispersion angle of a nano-diffraction spot in a cross section of element.

Although depending on the material for the antiferromagnetic film, the lattice spacing of the antiferromagnetic film is generally different from that of the pinned layer 14, spacer layer 16, and free layer 18. Consequently, the orientation dispersion angle can be separately calculated for each layer. For example, the lattice spacing of platinum manganese (PtMn) is often different from that of the pinned layer 14, spacer layer 16, and free layer 18. Since the platinum manganese (PtMn) is made in a relatively thick film, it is a suitable material for measuring dispersion in crystalline orientation. For the pinned layer 14, spacer layer 16, and free layer 18, the pinned layer 14 and the free layer 18 may have different crystal structures such as the bcc and fcc structures. Consequently, the pinned layer 14 and the free layer 18 have different dispersion angles.

(Another Magnetoresistive Element)

The spin-filtering element according to the present invention can be applied not only the typical spin-valve type magnetoresistive element having a pinned layer as described above but also a dual-free type magnetoresistive element in which both the lower and upper magnetic layers sandwiching the spacer layer are formed of the free layer, respectively, and no pinned layer is included (Hou et al., Pub. No. US 2005/0088789-A1).

Even in this case, the effect of improving the MR ratio by the spin-filtering film according to the present invention can also be attained, and the spin-filtering film is applicable to the dual-free type magnetoresistive element as it is. The spin-filtering layer may be arranged in the first magnetization free layer, in the second magnetization free layer, in the interface between the first magnetization free layer and the intermediate layer, in the interface between the intermediate layer and the second magnetization free layer, or in the interface of the second magnetization free layer opposite to the interface that is in contact with the intermediate layer. When two spin-filtering layers according to the present invention are provided, two spin-filtering layers may be arranged in one free layer or in two free layers.

(Magnetic Head)

FIG. 12 shows the magnetoresistive element according to the embodiment of the present invention which is incorporated in a magnetic head. FIG. 12 is a cross-sectional view of the magnetoresistive element taken along a direction substantially parallel to the air bearing surface facing a magnetic recording media (not shown). FIG. 13 is a cross-sectional view of the magnetoresistive element taken along a direction perpendicular to the air bearing surface (ABS).

The magnetic head shown in FIG. 12 has a so-called hard abutted structure. The lower electrode 11 and the upper electrode 20 are provided under and over the magnetoresistive film SV, respectively. In FIG. 12, bias magnetic field application films 41 and insulating films 42 are stacked on the both sides of the magnetoresistive film. As shown in FIG. 13, a protective layer 43 is provided in the air bearing surface of the magnetoresistive film.

A sense current for the magnetoresistive film is supplied by the lower electrode 11 and the upper electrode 20 perpendicularly to the plane as shown by arrow A, the electrodes 11 and 20 being arranged under and over the magnetoresistive film. Further, the pair of bias magnetic field application films 41, 41, provided on the both sides of the magnetoresistive film, applies a bias magnetic field to the magnetoresistive film. The bias magnetic field controls the magnetic anisotropy of the free layer 18 in the magnetoresistive film to make the free layer 18 into a single domain. This stabilizes the domain structure of the free layer. It is thus possible to suppress Barkhausen noise associated with movement of magnetic domain walls. The present invention improves the S/N ratio of the magnetoresistive film. Accordingly, the application of the present invention to a magnetic head enables sensitive magnetic reproduction.

(Hard Disk and Head Gimbal Assembly)

The magnetic head shown in FIG. 13 may be incorporated in a read/write integrated magnetic head assembly, which can then be mounted in a magnetic recording apparatus. FIG. 14 is a perspective view schematically showing the configuration of a major portion of such a magnetic recording apparatus. A magnetic recording apparatus 150 according to the embodiment is of a type using a rotary actuator. In this figure, a magnetic disk 200 is installed on a spindle 152. The magnetic disk 200 is rotated in the direction of arrow A by a motor (not shown) that responds to control signals from a drive controller (not shown). The magnetic recording apparatus 150 according to the embodiment of the present invention may comprise a plurality of magnetic disks 200.

A head slider 153 is attached to the tip of a suspension 154 of the thin film to read from and write to the magnetic disk 200. The head slider 153 has a magnetic head mounted near the tip thereof and including the magnetoresistive element according to any of the above embodiments.

When the magnetic disk 200 rotates, the air bearing surface (ABS) of head slider 153 is held so as to float on the surface of the magnetic disk 200 by a predetermined height. Alternatively, the head slider 153 may be of a so-called in-contact type contacting to the magnetic disk 200.

The suspension 154 is connected to one end of an actuator arm 155. A voice coil motor 156, a kind of linear motor, is provided on the other end of the actuator arm 155. The voice coil motor 156 is formed of a magnetic circuit including a driving coil (not shown) wound around a bobbin and a permanent magnet and a counter yoke arranged opposite to each other so as to sandwich the coil therebetween.

The actuator arm 155 is held by ball bearings (not shown) provided at two vertical positions of the spindle 157. The actuator arm 155 can be rotatably slid by the voice coil motor 156.

FIG. 15 is an enlarged perspective view of a part of the head gimbal assembly including tip end side of the actuator arm 155, which is viewed from the disk. The assembly 160 has the actuator arm 155, and the suspension 154 is connected to one end of the actuator arm 155. The head slider 153 is attached to the tip of the suspension 154, and the head slider 153 comprises a magnetic head including the magnetoresistive element according to any of the above embodiments. The suspension 154 has leads 164 used to write and read signals. The leads 164 are electrically connected to respective electrodes in the magnetic head incorporated in the head slider 153. Reference numeral 165 in the figure denotes electrode pads of the assembly 160.

The present invention comprises the magnetic head including the magnetoresistive element according to any of the above embodiments of the present invention. This makes it possible to reliably read information magnetically recorded on the magnetic disk 200 at a recording density higher than that in the prior art.

(Magnetic Memory)

A magnetic memory using the magnetoresistive element according to an embodiment of the present invention will now be described. The magnetoresistive element according to the embodiment of the present invention can be used to realize a magnetic memory such as a magnetic random access memory (MRAM) in which memory cells are arrayed in a matrix.

FIG. 16 is a diagram showing an example of the matrix configuration of a magnetic memory according to an embodiment of the present invention. This figure shows the circuit configuration in which memory cells are arrayed. The magnetic memory comprises a column decoder 350 and a row decoder 351 to select one bit in the array. A bit line 334 and a word line 332 are used to turn on and uniquely select a switching transistor 330. Detection by a sense amplifier 352 enables reading of the bit information recorded in the magnetic recording layer (free layer) in the magnetoresistive film. To write bit information, a write current is passed through a particular word line 323 and a particular bit line 322 to generate a magnetic field to be applied.

FIG. 17 is a diagram showing another example of the matrix configuration of a magnetic memory according to an embodiment of the present invention. In this case, one of bit lines 322 is selected by a decoder 361, while one of the word lines 334 is selected by a decoder 360; the bit lines 322 and the word lines 334 are arrayed in a matrix. Thus, a particular memory cell in the array is selected. Each memory cell has a structure in which the magnetoresistive film SV and a diode D are connected in series. Here, the diode D serves to prevent a sense current from bypassing in the memory cells other than the selected magnetoresistive film SV. A write operation is performed by using a magnetic field generated by passing a write current through each of a particular bit line 322 and a particular word line 323.

Figure 18:
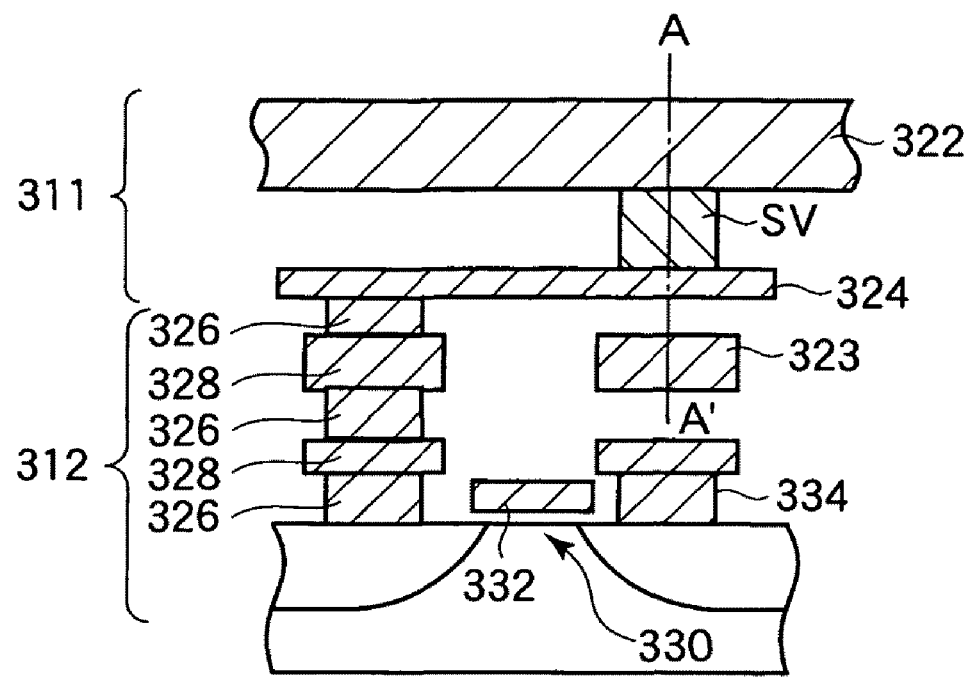
FIG. 18 is a cross-sectional view showing a main part of the magnetic memory according to the embodiment of the present invention.
Figure 19:
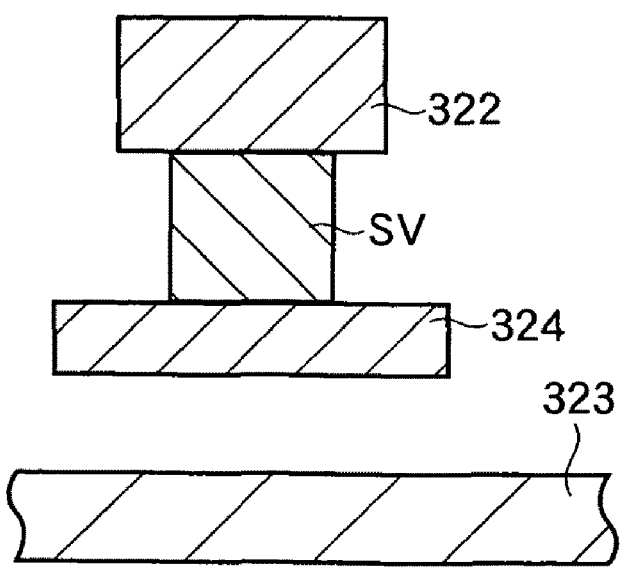
FIG. 19 is a cross-sectional view taken along the A-A' line in FIG. 18.

FIG. 18 is a cross-sectional view showing a major portion of a magnetic memory according to an embodiment of the present invention. FIG. 19 is a cross-sectional view taken along the line A-A' in FIG. 18. The structure shown in these figures corresponds to a memory cell for one bit included in the magnetic memory shown in FIG. 16 or 17. The memory cell has a storage element 311 and an address selecting transistor 312.

The storage element 311 has the magnetoresistive film SV and a pair of wires 322 and 324 connected to the magnetoresistive film SV.

On the other hand, the address-selecting transistor 312 is provided with a transistor 330 connected to the magnetoresistive film through vias 326 and buried wires 328. The transistor 330 performs a switching operation in accordance with a voltage applied to a gate 332 to controllably open and close the current paths between the magnetoresistive film SV and a wire 334.

A write wire 323 is provided below the magnetoresistive film SV in a direction orthogonal to the wire 322. The write wires 322 and 323 can be formed of, for example, aluminum (Al), copper (Cu), tungsten (W), tantalum (Ta), or an alloy containing any one of these elements.

In the memory cell thus constituted, to write bit information to the magnetoresistive film SV, a write pulse current is passed through the wires 322 and 323 to induce a synthetic magnetic field. The synthetic magnetic field is applied to appropriately reverse the magnetization of the recording layer of the magnetoresistive film.

Further, to read bit information, a sense current is passed through the wire 322, the magnetoresistive film SV including the magnetic recording layer, and the lower electrode 324. Then, the resistance value or a change in resistance value of the magnetoresistive film SV is measured.

The magnetic memory according to the embodiment of the present invention uses the magnetoresistive element according to any of the above embodiments. Consequently, even with a reduction in cell size, the magnetic domains in the recording layer are surely controlled to allow write and read operations to be reliably performed.

Other Embodiments

The embodiment of the present invention is not limited to the above described embodiment, and can be extended and varied. The extended and varied embodiments are also within the technical scope of the present invention. For the specific structure of the magnetoresistive film as well as the shapes and materials of the electrodes, bias application film, insulating film, and the like, those skilled in the art can similarly implement the present invention to produce similar effects by making appropriate selections from the corresponding well-known ranges. For example, when the magnetoresistive element is applied to a reproducing magnetic head, the detection resolution of the magnetic head can be defined by providing magnetic shields on both sides of the element.

FIGS. 20A and 20B are perspective views showing examples of magnetoresistive elements having an SF layer 21 arranged in an interface between the magnetization pinned layer 14 and the intermediate layer 16.

FIGS. 21A and 21B are perspective views showing examples of magnetoresistive elements having an SF layer 21 arranged in an interface between the intermediate layer 16 and the magnetization free layer 18.

Figure 22A:
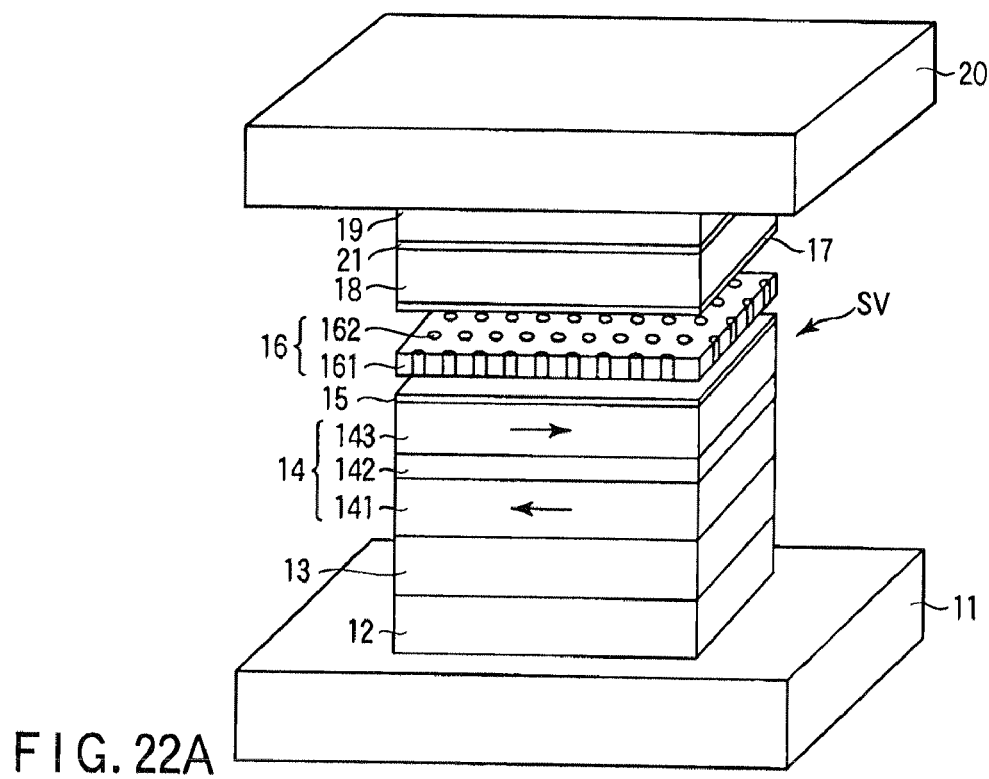
FIGS. 22A and 22B are perspective views of magnetoresistive elements according to embodiments of the present invention.
Figure 22B:
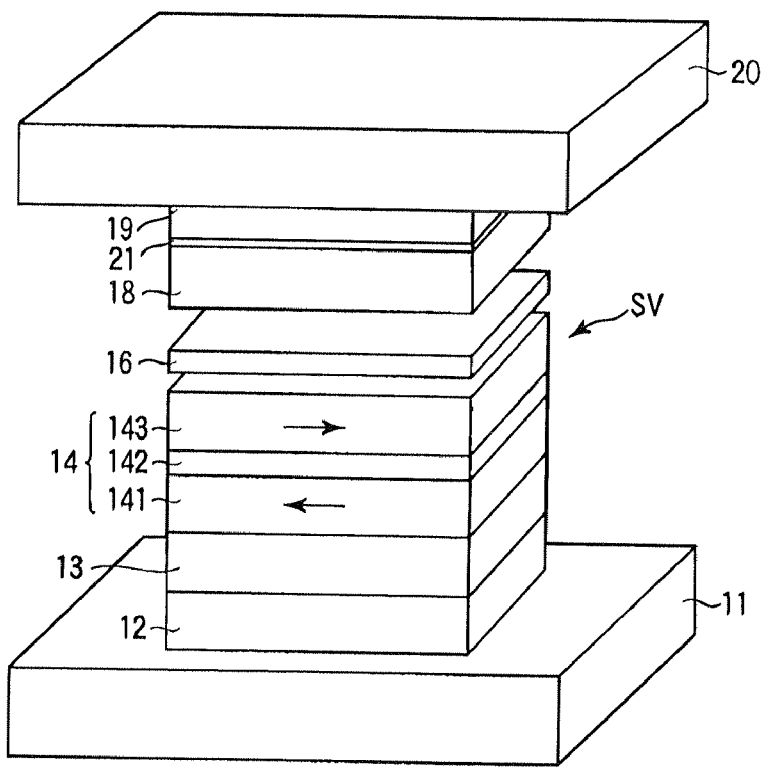

FIGS. 22A and 22B are perspective views showing examples of magnetoresistive elements having an SF layer 21 arranged in an interface between the magnetization free layer 18 and the cap layer 19.

Further, the present invention can be applied to a magnetic head or magnetic recording apparatus based on a perpendicular magnetic recording system as well as a longitudinal magnetic recording system. Moreover, the magnetic recording apparatus according to the present invention may be a so-called a rigid type constantly provided with particular recording media or a so-called removable type that allows recording media to be exchanged.

The scope of the present invention also includes all the magnetoresistive elements, magnetic heads, magnetic recording apparatuses, and magnetic memories that can be implemented by those skilled in the art by appropriately changing the designs of the above magnetic heads and magnetic recording apparatuses described above, based on the embodiments of the present invention. For example, the magnetoresistive element according to an embodiment of the invention can be used in all HDD compatible with high recording density and can be applied to the recording apparatus such as personal computers, portable audio/video players, car navigation system and video cameras for consumer applications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
    a magnetoresistive film comprising a magnetization pinned layer a magnetization direction of which is substantially pinned in one direction, a magnetization free layer a magnetization direction of which is varied depending on an external magnetic field, an intermediate layer arranged between the magnetization pinned layer and the magnetization free layer, a cap layer arranged on the magnetization pinned layer or on the magnetization free layer, and a functional layer formed of an oxygen- or nitrogen-containing material and arranged in the magnetization pinned layer, in the magnetization free layer, in an interface between the magnetization pinned layer and the intermediate layer, in an interface between the intermediate layer and the magnetization free layer, or in an interface between the magnetization pinned layer or the magnetization free layer and the cap layer; and
    a pair of electrodes which pass a current perpendicularly to a plane of the magnetoresistive film,
    wherein a crystalline orientation plane of the functional layer is different from a crystalline orientation plane of its upper or lower adjacent layer.

2. The magnetoresistive element according to claim 1, wherein reciprocal lattice spots of the crystalline orientation plane of the functional layer and reciprocal lattice spots of the crystalline orientation plane of its upper or lower adjacent layer are inclined to each other at 10 to 90 degrees.

3. A magnetoresistive element comprising:
a magnetoresistive film comprising a magnetization pinned layer a magnetization direction of which is substantially pinned in one direction, a magnetization free layer a magnetization direction of which is varied depending on an external magnetic field, an intermediate layer arranged between the magnetization pinned layer and the magnetization free layer, a cap layer arranged on the magnetization pinned layer or on the magnetization free layer, and a functional layer arranged in the magnetization pinned layer, in the magnetization free layer, in an interface between the magnetization pinned layer and the intermediate layer, in an interface between the intermediate layer and the magnetization free layer, or in an interface between the magnetization pinned layer or the magnetization free layer and the cap layer; and
a pair of electrodes which pass a current perpendicularly to a plane of the magnetoresistive film,
wherein reciprocal lattice spots of the crystalline orientation plane of the functional layer and reciprocal lattice spots of the crystalline orientation plane of its upper or lower adjacent layer are inclined to each other at 10 to 90 degrees.

4. The magnetoresistive element according to claim 1, wherein the functional layer has a crystalline orientation dispersion angle of 5 degrees or less.

5. The magnetoresistive element according to claim 1, wherein the magnetization pinned layer or the magnetization free layer has a crystalline orientation dispersion angle of 5 degrees or less.

6. The magnetoresistive element according to claim 1, wherein the functional layer has a thickness from 0.3 nm to 5 nm.

7. The magnetoresistive element according to claim 1, wherein the functional layer comprises a material selected from the group consisting of Fe, Co, Ni, Mn and Cr.

8. The magnetoresistive element according to claim 1, wherein the functional layer comprises a material selected from the group consisting of Al, Si, Mg, Zr, Hf, Nb, W, Ti and Pd.

9. The magnetoresistive element according to claim 1, wherein the intermediate layer is a metal layer comprising an element selected from the group consisting of Au, Ag and Cu.

10. The magnetoresistive element according to claim 1, wherein the intermediate layer comprises an insulating layer containing nitrogen or oxygen and a current path penetrating the insulating layer.

11. The magnetoresistive element according to claim 9, wherein the current path comprises an element selected from the group consisting of Au, Ag, Cu, Fe, Co and Ni.

12. A magnetoresistive element comprising:
a magnetoresistive film comprising a first magnetization free layer a magnetization direction of which is varied depending on an external magnetic field, a second magnetization free layer a magnetization direction of which is varied depending on an external magnetic field, an intermediate layer arranged between the first magnetization free layer and the second magnetization free layer, and a functional layer arranged in the first magnetization free layer, in the second magnetization free layer, in an interface between the first magnetization free layer and the intermediate layer, in an interface between the intermediate layer and the second magnetization free layer, or in an interface of the second magnetization free layer opposite to the interface that is in contact with the intermediate layer; and
a pair of electrodes which pass a current perpendicularly to a plane of the magnetoresistive film,
wherein a crystalline orientation plane of the functional layer is different from a crystalline orientation plane of its upper or lower adjacent layer.

13. The magnetoresistive element according to claim 12, wherein reciprocal lattice spots of the crystalline orientation plane of the functional layer and reciprocal lattice spots of the crystalline orientation plane of its upper or lower adjacent layer are inclined to each other at 10 to 90 degrees.

14. A magnetic head gimbal assembly comprising the magnetoresistive element of claim 1.

15. A magnetic recording apparatus comprising the magnetic head gimbal assembly of claim 14.

16. A method of manufacturing a magnetoresistive element comprising a magnetoresistive film comprising a functional layer formed of an oxygen- or nitrogen-containing material and arranged in a magnetization pinned layer, in a magnetization free layer, in an interface between the magnetization pinned layer and an intermediate layer, in an interface between the intermediate layer and the magnetization free layer, or in an interface between the magnetization pinned layer or the magnetization free layer, the method comprising:
depositing a metal layer and exposing the metal layer to either oxygen or nitrogen gas to form the functional layer; and
repeating the depositing step two or more times.

17. The method according to claim 16, wherein the metal layer comprises a material selected from the group consisting of Fe, Co, Ni, Mn and Cr.

18. The method according to claim 16, wherein the functional layer is a layer containing nitrogen, and a thickness of the functional layer in T nanometers and a number of times N, by which the modules are repeated, satisfy the following formula:

$$N \geq (T/0.5) \times x,$$

where x is a constant of 1 to 2, and $T \geq 1$.

19. The method according to claim 16, wherein a thickness of the metal layer deposited in one module is 1 nm or less.

20. The method according to claim 16, wherein the functional layer is a layer containing oxygen, and a thickness of the functional layer in T nanometers and a number of times N, by which the modules are repeated, satisfy the following formula:

$$N \geq (T/1) \times x,$$

where x is a constant of 1 to 2, and $T \geq 1$.

* * * * *